_[19]_ United States Patent
Majidi-Ahy et al.

[11] Patent Number: 5,231,349
[45] Date of Patent: Jul. 27, 1993

[54] MILLIMETER-WAVE ACTIVE PROBE SYSTEM

[75] Inventors: Gholamreza Majidi-Ahy, Sunnyvale; David M. Bloom, Portola Valley, both of Calif.

[73] Assignee: The Board of Trustees of the Leland Stanford Junior University, Stanford, Calif.

[21] Appl. No.: 585,425

[22] Filed: Dec. 24, 1990

Related U.S. Application Data

[60] Division of Ser. No. 318,744, Mar. 3, 1989, Pat. No. 5,003,253, which is a continuation-in-part of Ser. No. 196,998, May 20, 1988, Pat. No. 4,983,910.

[51] Int. Cl.⁵ .................. G01R 1/067; G01R 1/06
[52] U.S. Cl. .................. 324/158 P; 324/72.5; 324/158 F
[58] Field of Search ............... 324/158 P, 158 F, 72.5, 324/601; 333/33, 34, 246, 247; 455/327

[56] References Cited

U.S. PATENT DOCUMENTS

| | | |
|---|---|---|
| 2,904,685 | 9/1959 | Salmet . |
| 3,194,976 | 7/1965 | Ludwig et al. . |
| 3,343,069 | 9/1967 | Tsuda . |
| 3,402,340 | 9/1968 | Ringereide . |
| 3,868,588 | 2/1975 | Schwartzmann et al. . |
| 4,118,670 | 10/1978 | Dickens ................ 455/327 |
| 4,122,449 | 10/1978 | Endo .................. 342/104 |
| 4,155,056 | 5/1979 | Cross et al. ........... 333/195 |
| 4,259,743 | 3/1981 | Kaneko et al. .......... 455/81 |
| 4,348,646 | 9/1982 | Newton et al. . |
| 4,514,022 | 4/1985 | Payne . |
| 4,523,163 | 6/1985 | Houdart et al. . |
| 4,531,105 | 7/1985 | Kumar . |
| 4,578,656 | 3/1986 | Lacour et al. .......... 333/204 |
| 4,593,243 | 6/1986 | Lao et al. . |
| 4,660,006 | 4/1987 | Tajima et al. . |
| 4,731,596 | 3/1988 | Cruchon et al. ........ 333/204 |
| 4,742,571 | 5/1988 | Letron ................ 455/327 |
| 4,749,949 | 6/1988 | Albin et al. . |
| 4,758,775 | 7/1988 | Roos . |
| 4,758,776 | 7/1988 | Griffin ................ 324/638 |
| 4,791,363 | 12/1988 | Logan . |
| 4,803,419 | 2/1989 | Roos . |
| 4,816,767 | 3/1989 | Cannon et al. ......... 324/601 |
| 4,853,613 | 8/1989 | Sequeira et al. ....... 324/601 |
| 5,014,018 | 5/1991 | Rodwell et al. ........ 333/247 |
| 5,021,757 | 6/1991 | Kobayashi et al. ...... 333/204 |

OTHER PUBLICATIONS

"Improved Millimeter Wave Signal Analysis", by David, RF & Microwave Symposium & Exhibit., Apr. 1983, pp. 1-5, 8-21.

Primary Examiner—Ernest F. Karlsen
Attorney, Agent, or Firm—Rosenblum, Parish & Isaacs

[57] ABSTRACT

Three classes of active probes all with coaxial inputs and coplanar waveguide probe tips are described. A millimeter-wave active probe for generating signals with frequencies about 50 gHz and supplying same to millimeter-wafer including a substrate upon which a frequency multiplier consisting of filter sections and impedance matching sections and nonlinear elements are integrated in uniplanar transmission line medium. Also disclosed is a harmonic mixer probe to step down RF received from an integrated circuit to a lower frequency by mixing it with the harmonics of a local oscillator signal. Also disclosed is an S-parameter active probe for on-wafer measurement of the S-parameters of a two port millimeter-wave device or integrated circuit by injecting millimeter-wave frequencies and simultaneously tapping off a portion of the injected signal, the transmitted signal and the reflected signal and stepping all signals down in frequency to a frequency compatible with currently available test equipment such as the HP8510 automatic network analyzer. This is the first and only all-electronic millimeter-wave on-wafer S-parameter measurement device available at present.

10 Claims, 16 Drawing Sheets

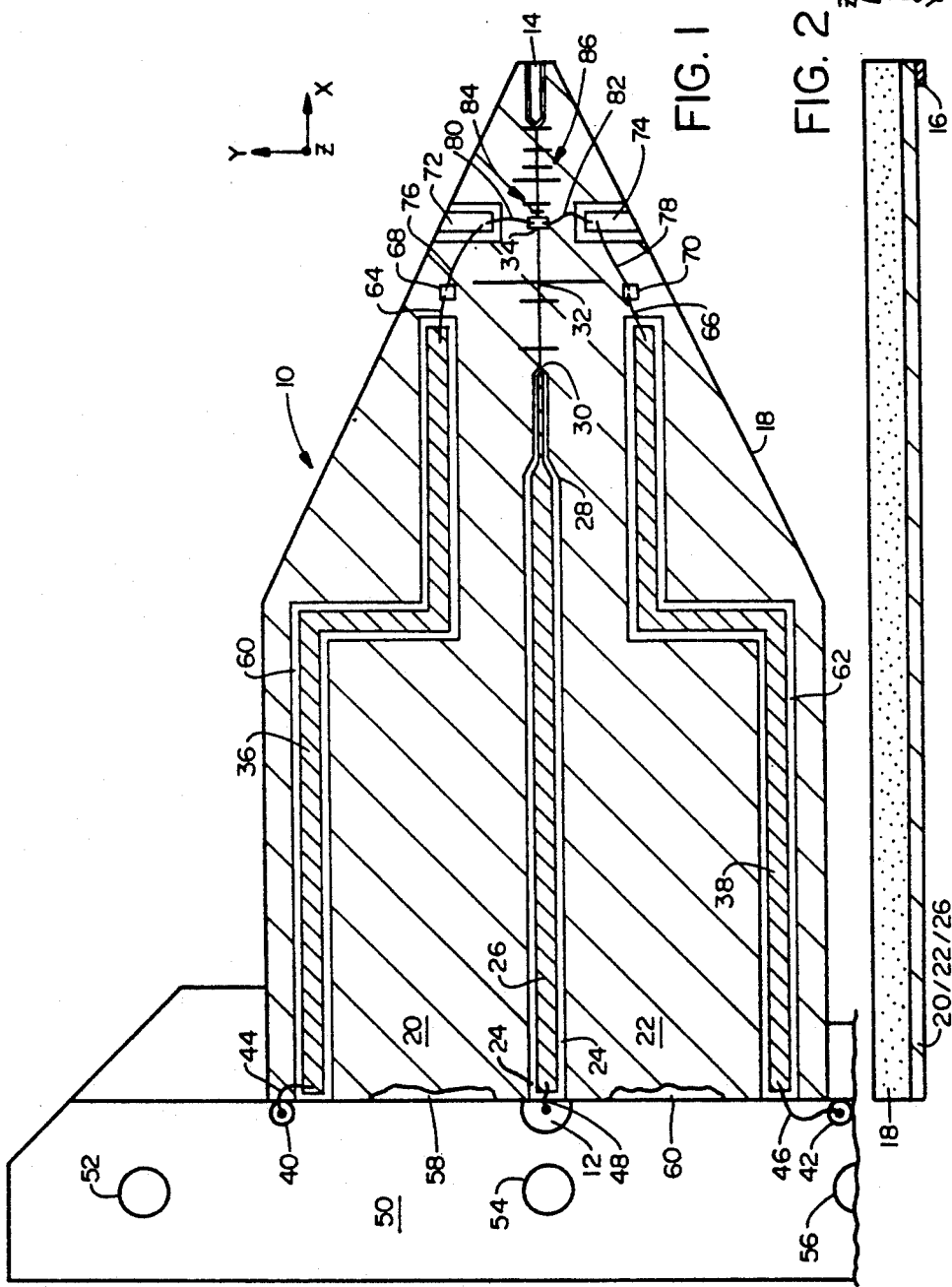

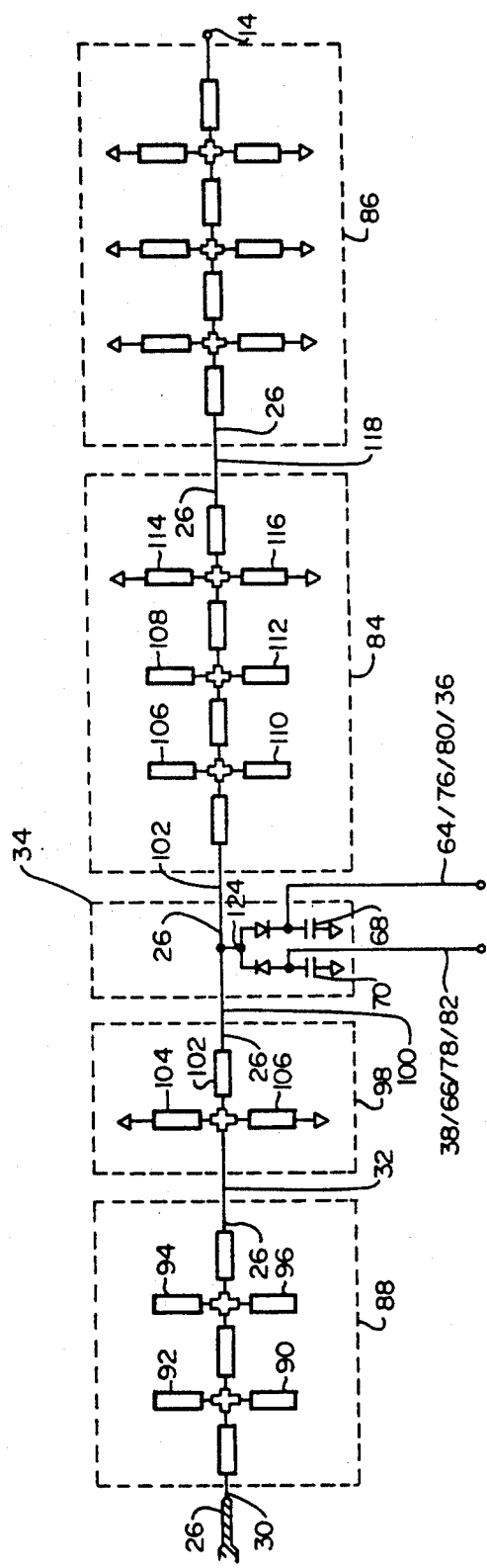
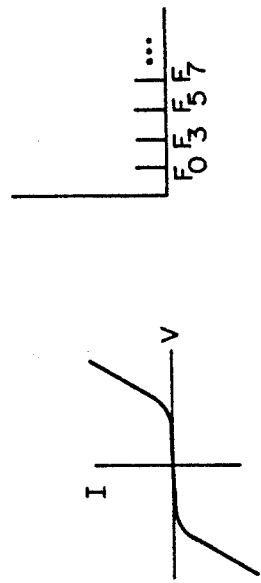
FIG. 3
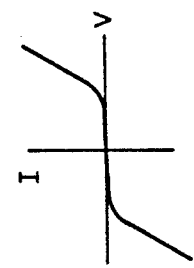
FIG. 4
FIG. 5

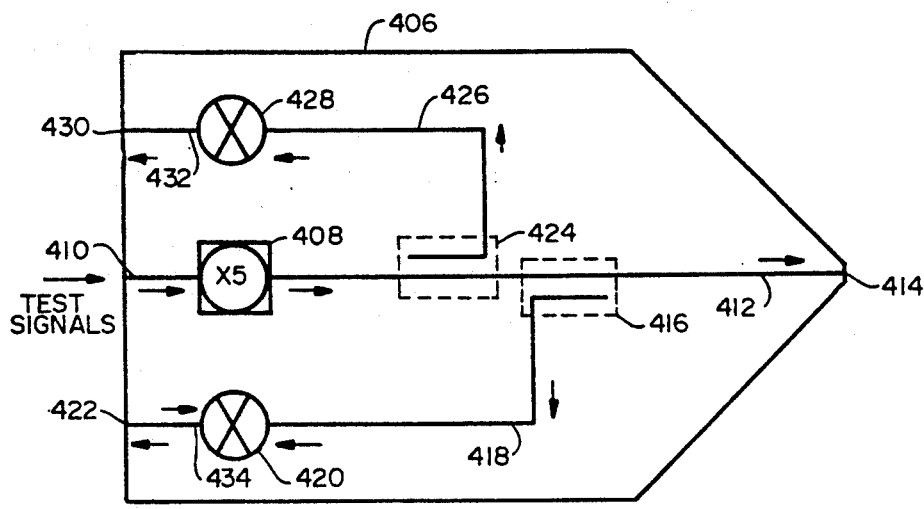
FIG. 21
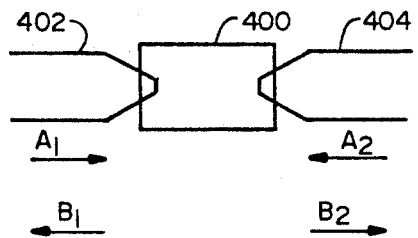
FIG. 22
$[B] = [S][A]$
FIG. 23
$S_{11} = |S_{11}| e^{j \angle S_{11}}$
$= x + jy$
FIG. 25
$B_1 = S_{11}A_1 + S_{12}A_2$
$B_2 = S_{21}A_1 + S_{22}A_2$
FIG. 24

MILLIMETER-WAVE ACTIVE PROBE SYSTEM

The U.S. government has a paid-up license in this invention and the right in limited circumstances to require the patent owner to license others on reasonable terms as provided for by the terms of Air Force Office of Scientific Research contract No. F49620-85K-0016.

This is a division of U.S. Ser. No. 07/318,744, filed Mar. 3, 1989, now U.S. Pat. No. 5,003,253, which is a continuation-in-part of a co-pending U.S. patent application Ser. No. 07/196,988, filed May 20, 1988 now U.S. Pat. No. 4,983,910, entitled "Millimeter-Wave Active Probe".

BACKGROUND OF THE INVENTION

This is a division of Ser. No. 07/318,744, filed Mar. 3, 1989, now U.S. Pat. No. 5,003,253, which is a continuation-in part of a co-pending U.S. patent application Ser. No. 07/196,998, filed May 20, 1988 now U.S. Pat. No. 4,983,910, entitled "Millimeter-Wave Active Probe". The U.S. Government has a paid-up license int his invention and the right in limited circumstances to require the patent owner to license others on reasonable terms as provided for by the terms of Air Force Office of Scientific Research contract No. F49620-85K-0016.

The invention pertains to the field of testing and characterization of millimeter-wave and very high speed devices and integrated circuits such as those fabricated on gallium arsenide. More particularly, the invention pertains to the field of generating millimeter-wave frequencies for test purposes and guiding these test signals to a particular point on a device or an integrated circuit to be characterized.

Conventional millimeter-wave sources have their outputs in waveguide configuration. This creates a great deal of complexity and inconvenience in trying to inject signals from a waveguide at particular points of the microscopic structure of a millimeter-wave or an ultrafast device or integrated circuit. With waveguide output of conventional millimeter-wave test signal sources, it is necessary to plumb the waveguide to the location of the integrated circuit and use suitable adaptors and test fixtures to couple the energy out of the waveguide and onto the integrated circuit. This must be done with a minimum of losses caused by scattering of energy into higher order modes and with a minimum of reflection back toward the input of energy propagating in the desired mode at discontinuities. Because of the awkwardness and inconvenience of using waveguide output signal sources, high frequency coaxial cable and connectors and wafer probes having a planar configuration using coplanar waveguides have been developed for up to 50 gHz. A tapered wafer probe with a planar configuration can more easily be used to contact pads on the device or integrated circuit.

Cascade Microtech Inc. currently makes a passive coplanar waveguide probe for use up to 50 gHz to contact devices or integrated circuit pads. This probe has a coaxial cable input to receive a test signal at a frequency below 50 gHz to be injected and couples energy from this test signal into a coplanar waveguide printed on the surface of the insulating substrate of the probe. This substrate tapers to a point where contact pads coupled to the coplanar waveguide are formed. Nickel plated probe tips are placed in contact with the contact pads on the integrated circuit to be tested to inject the test signal.

One difficulty with using such a probe is that high frequency test sources capable of generating test signals at approximately 100 gHz with coaxial outputs are not available. Another difficulty is that at least the coaxial section of the probe is not usable at frequencies above 50 gHz. This is because coaxial cable and connectors are not currently for operation at frequencies above 50 gHz. Coaxial cable cannot be used at these high frequencies because the dimensions of the cable would have to be so small as to preclude a practical structure. This restriction on dimensions is a result of the solutions to Maxwell's equations. It is desirable to propagate energy in only one mode, i.e., lowest order or the fundamental mode. The cutoff frequency for the higher order modes for coaxial cable is set by the circumference of the outer conductor. When this dimension approaches within the wavelength of the signal to be guided through the coaxial cable, scattering of energy into higher order modes occurs which is undesirable. Thus, to guide higher frequencies with coaxial cable requires the dimensions of the cable to be made increasingly smaller. However, this shrinking of the cable must be made proportionally to all dimensions to maintain an industry standard characteristic impedance of 50 ohms. Because of mechanical and electrical constraints which have yet to be overcome, at the current time, no coaxial cable exists which can be used above 50 gHz.

Signal sources which can provide output test signals at frequencies above 50 gHz are available, but the output configuration of these systems is waveguide instead of coaxial. One difficulty with using a planar probe in connection with a waveguide configuration output from a high frequency millimeter-wave source is that an adapter must be made for use between the waveguide configuration and the coaxial configuration at the input of the probe. Another difficulty is that the coaxial part of the probe cannot be used above 50 gHz with today's technology. Because the shapes of the rectangular waveguide at the output of the test source and the coaxial cable at the input of the probe are mismatched, making a suitable adapter is difficult and causes losses from the resulting discontinuity as will be understood by those skilled in the art. Coaxial systems can currently be used to guide millimeter-wave energy at or below approximately 50 gHz to planar configuration IC passive probes such as the Cascade Microtech Inc. probe. However, to extend the frequency of sources beyond approximately 50 gHz requires the use of frequency multipliers to raise the frequency and requires the above-described waveguide-to-coax fixtures to couple energy from the waveguide output of the multiplier into the chip under test.

Needle probes which were in use before the introduction of the planar configuration probe by Cascade Microtech Inc. are unacceptable at the very high frequencies prevalent in the microwave and millimeter-wavelength bands. The reason for this is that the inductance of the needle probe wire presents a very high impedance to the test signal microwave and millimeter-wavelength frequencies. This causes difficulty in coupling sufficient amounts of energy to the chip under test because of the impedance mismatch between the 50 ohm line coaxial cable and the impedance of the wire probe. This impedance mismatch causes reflection of power at the interface thereby limiting the amount of power which is available for coupling to the chip under test.

Recently, Cascade Microtech Inc. probes with 2.4 millimeter coaxial connectors have been made publicly available. These probes allow single probe coaxial test operations to be made up to 50 gHz. However, such probes still cannot be used at frequencies above 50 gHz, the frequency range which many new fast technologies are operating.

An alternative approach would be to generate millimeter-wave signals closer to the input of the device or integrated circuit on the wafer under test. For example, the signal could be generated directly on the wafer by mixing two optical beams which are separated in frequency by the desired millimeter-wave test frequency in a nonlinear device on the wafer. The disadvantage of this approach is the need for two complex optical systems and the need for an appropriate nonlinear device formed on the wafer under test. This makes the approach unattractive for many users.

Therefore, a need has arisen for a system which can generate millimeter-wave frequencies above 50 gHz easily with low loss and with single mode operation for use in testing and characterization of millimeter-wave and ultra-fast devices and integrated circuits. Such a system must have a configuration to allow easy coupling of the energy to the integrated circuit and must not require any special constructions or device formation on the wafer under test. Further, the system must have a simple interface with conventional microwave sources and must be efficient in coupling large amounts of the millimeter-wave power generated to the chip under test.

Further, it is important to be able to take high frequency signals off the device or the integrated circuits under test and step them down in frequency to a frequency compatible with the vast majority of test equipment currently available. Therefore, a need has arisen for an integrated, planar probe structure in the form of a harmonic mixer which can perform such a step down function.

Finally, it is essential to be able to characterize two-port devices or integrated circuits operating at very high frequencies in terms of their S-parameters at the actual operating frequencies. To do this requires an S-parameter active probe which injects signals with frequencies on the order of 100 gHz to the device under test on-wafer and which can guide a known amount of 100 gHz reflected power to an output port for measurement while simultaneously stepping the reflected signal frequency down to a frequency compatible with existing test equipment. Further, this probe must also guide a portion of the incident 100 gHz signal back to a test output for measurement while simultaneously stepping it down to a lower frequency capable of measurement.

SUMMARY OF THE INVENTION

According to the teachings of the invention, there is taught a modification to the structure of prior art, planar-configuration, millimeter-wave wafer probes by placement or integration on the probe substrate of a circuit including at least one nonlinear element for frequency multiplication. This nonlinear element is coupled with suitable filter sections and impedance matching sections which are integrated on the substrate of the wafer probe in coplanar waveguide format to comprise a frequency multiplier active probe. The combination is capable of receiving test signals of a lower frequency and multiplying them to the frequency range above 50 gHz and is capable of filtering out undesired frequency components, all energy transfer being in the single fundamental mode and without substantial losses of power from reflection or scattering into higher order modes. The combination is also quite convenient to use because of the coaxial cable input.

The construction of the probe, in the preferred embodiment, is coplanar waveguide throughout with a beamlead GaAs diode pair as the nonlinear element. The substrate of the wafer probe, in the preferred embodiment, is insulating alumina, although other insulating substrates may also be used providing they have a similar isotropic dielectric constant and thickness. A planar surface of the substrate is metalized with a titanium-tungsten-gold conductive layer which is approximately 1 micron thick. This metalization pattern is photolithographically etched to form two groundplanes separated by an insulating gap through which an RF signal conductor is routed.

The substrate is tapered and has a wide end and a narrow end. At the wide end, a coaxial connector is mounted. The outer conductor of the coaxial connector is bonded by conductive epoxy to the two groundplanes. The center conductor of the coaxial connector is wire or ribbon bonded to the center RF signal conductor. The dimensions of the center signal conductor, the gaps separating it from the two groundplanes, and the thickness of the metalization as well as the thickness and dielectric constant are selected so as to provide a 50 ohm characteristic impedance for the input and output of the circuit on the substrate in the preferred embodiment although other characteristic impedances may also be used.

The frequency multiplier is comprised of several sections. The first section is a low-pass filter consisting of a plurality of coplanar waveguide segments. The dimensions of the open circuit coplanar waveguide stubs and the line segments are such that the filter has a characteristic impedance of 50 ohms at the input frequency of approximately 20 gHz in the preferred embodiment. The dimensions of the low-pass filter elements are also selected so as to establish distributed inductive and capacitive reactances which establish a cut-off frequency which is slightly greater than the highest frequency in the input frequency band, i.e., approximately 25 gHz. The filter also has other predetermined impedance characteristics designed to suppress the propagation of undesired harmonics other than the 5th harmonic.

The output of the low pass filter and impedance matching circuit is coupled to an antiparallel pair of beam-lead GaAs diodes. These diodes are coupled through capacitors to the groundplane. The purpose of using matched, antiparallel diodes for an odd order frequency multiplier is to create a nonlinear element which will generate only odd-numbered harmonics of the input signal. Thus, for an input signal at 20 gHz, there will be a third harmonic at 60 gHz and a fifth harmonic at 100 gHz. There will also be higher order harmonics, but the designs of the filter and impedance matching sections are such that transmission of energy to the output at these higher harmonics and at the third harmonic is suppressed. In alternative embodiments, other multiplier structures can be used such as triplers or to multiply the frequency of the input signal by a factor of 7. In some alternative embodiments, the frequency multiplier may be a quadrupler. In a quadrupler embodiment, the even order harmonics are generated and the odd order harmonics are suppressed.

The antiparallel diode pair is coupled to the input of a bandpass filter comprising a plurality of one-quarter wavelength coupled line segments selected to synthesize the proper impedance characteristics at various frequencies. The dimensions of the stubs, interconnecting segments and metalization thickness, as well as the insulating gap widths, substrate thickness and dielectric constant are selected to establish certain impedance characteristics. In particular, these dimensions are established such that the input impedance at the fifth harmonic frequency is the complex conjugate of the output impedance of the diodes at the fifth harmonic frequency for maximum power transfer. The dimensions are also selected so that the input impedance is very large at the frequency of the input signal so as to reflect energy at this frequency back to the diodes. Further, the characteristic impedance looking into the input of the bandpass filter output impedance matching network at the frequency of the third harmonic and higher order harmonic such as seventh, ninth, etc., is substantially low, preferably near zero so as to suppress these harmonics. It does not matter which filter section suppresses the undesired harmonics as long as one of the filter sections does so.

The bandpass filter has a characteristic impedance looking into the input of 50 ohms at the fifth harmonic frequency. The output impedance of the bandpass filter is 50 ohms at the fifth harmonic frequency, and the structure is terminated in any structure suitable for use in probing millimeter-wave or ultra-fast devices or integrated circuit structures. In the preferred embodiment, a plated metal is used but the gold balls or any terminal structure such as those used by Cascade Microtech Inc. coplanar probes will suffice.

There is also disclosed a completely integrated version of the frequency multiplier with Schottky diodes and capacitors integrated on a gallium arsenide substrate.

Two different harmonic mixers are disclosed, one with a hybrid structure integrated as part of the harmonic mixer probe and one with a fully integrated structure. The purpose of the harmonic mixer probe is to receive high frequency RF signals from a device or an integrated circuit under test and to step the frequency down to a frequency which can be measured by existing test equipment. To do this the harmonic mixer probe receives local oscillator signals and guides them by coplanar waveguide to a nonlinear circuit surrounded on each side by a filter circuit. The purpose of this nonlinear circuit, which includes diodes in the preferred embodiment, is to generate mixing products one of which is a desired intermediate frequency. The purpose of the filters is to insure the maximum amount of the incoming RF gets to the diode circuit but does not get out to the output from which the intermediate frequency signals are taken and to insure that the intermediate frequency signals and the local oscillator signals do not get to the device under test. Further, the filters suppress the propagation of undesired mixing products and harmonics. This harmonic mixer probe is disclosed in hybrid form using beam lead diodes and chip capacitors and in fully integrated form using integrated capacitors and Schottky gallium arsenide diodes.

Further, there is disclosed a probe structure called an "S-parameter active probe" which is suitable for characterizing two-port integrated networks working at millimeter-wave frequencies. Full two-port millimeter-wave S-parameters of devices or IC's can be measured on-wafer by using two of these S-parameter active probes. The probe is comprised of a frequency multiplier section which receives 20 gHz range input test signals and steps them up in frequency to the 100 gHz range and outputs them to the device under test. The structure of this frequency multiplier may be any of the frequency multiplier structures detailed herein or some other compatible structure. Two harmonic mixer sections are integrated on the same substrate. These harmonic mixers are coupled to the output coplanar waveguide by integrated directional couplers in such a way that one of the harmonic mixers taps off a portion of the incident energy to the device under test and steps it down in frequency to a frequency compatible with currently available test equipment. The other harmonic mixer and directional coupler section is coupled so as to tap off a portion of the reflected energy from the device under test. This tapped off reflected energy is stepped down in frequency to a frequency compatible with measurement. The structures of the harmonic mixers can be any of the structures for harmonic mixers disclosed herein or some other compatible structure.

BRIEF DESCRIPTION OF THE DRAWINGS

FIG. 1 is a plan view of the structure of th millimeter-wave active probe according to one embodiment of the invention.

FIG. 2 is side elevation view of the probe of FIG. 1 looking down the y axis.

FIG. 3 is an electrical schematic diagram of the filter and matching sections in the frequency multiplier showing the number and relationship of coplanar waveguide segments making up the various filter and impedance matching sections and the types of terminations used on the stub lines.

FIG. 4 is an I-V characteristic curve of the antiparallel diodes used in the frequency multiplier.

FIG. 5 is a symbolic frequency spectrum plot of the harmonics generated by the frequency multiplier.

FIG. 21 is a diagram of an S-parameter active probe for millimeter-wave on-wafer measurement of S-parameters of devices or integrated circuits.

FIG. 22 is a diagram illustrating how S-parameter active probes can be used to measure S-parameters and the signals involved in such measurements.

FIG. 23 is a vector equation which defines the relationship between the signals measured in the test setup shown in FIG. 22.

FIG. 24 defines how the various S-parameters relate the vector quantities a and b.

FIG. 25 defines how a typical S-parameter can be expressed as a vector quantity.

DETAILED DESCRIPTION OF THE PREFERRED EMBODIMENT

Figure 6:
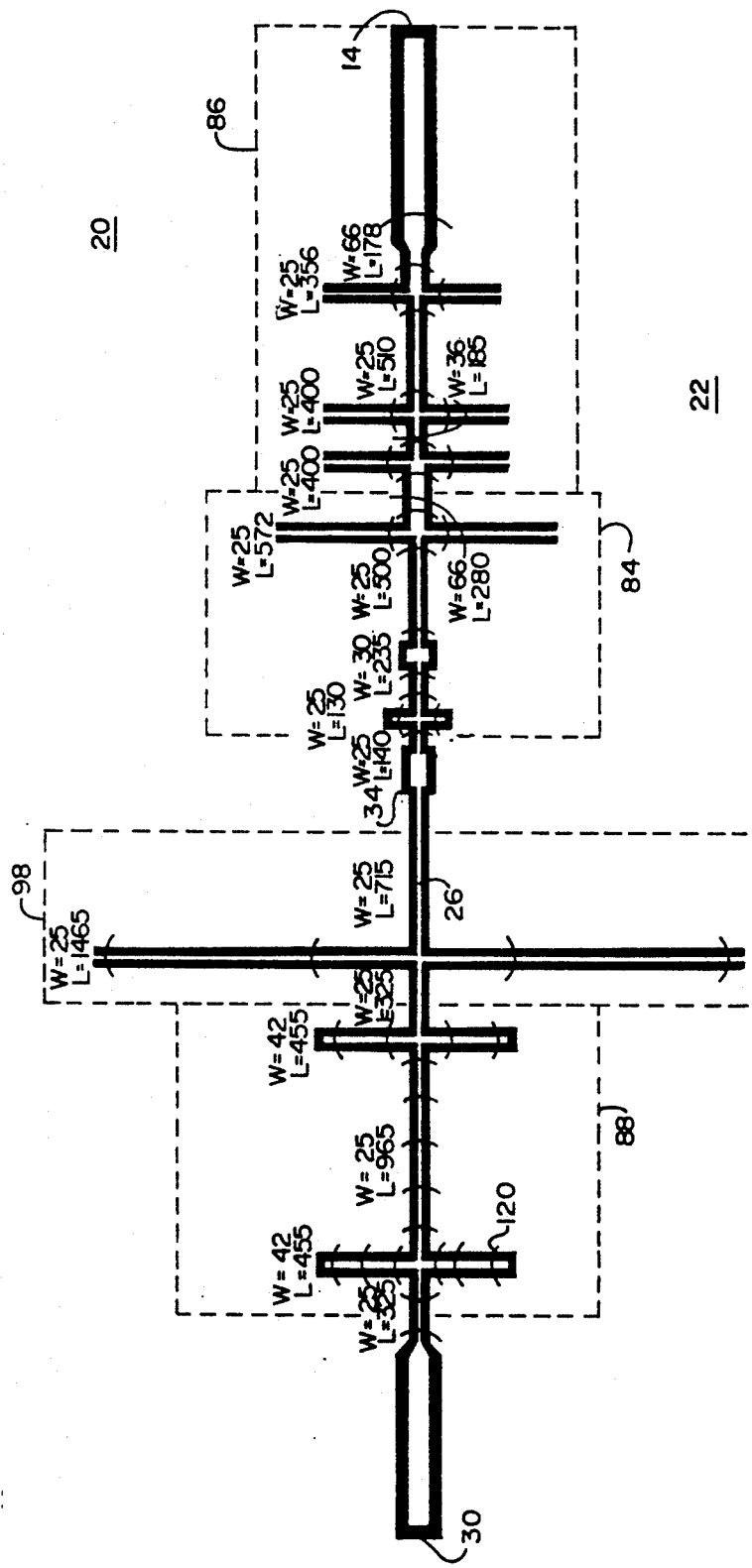
FIG. 6 is a scaled drawing of one embodiment of the filter and impedance matching sections showing the relative dimensions of all the structures.

Referring to FIG. 1, there is shown a plan view of an active millimeter-wave probe 10. FIG. 2 shows the probe 10 in elevation, i.e., looking down the Y-axis. The purpose of the active probe is to receive an input signal at a frequency on the order of 20 gHz at a coaxial connector 12 and to multiply-this signal in frequency by a factor of five for output for the active probe quintupler. Filtering must also be done to remove undesired harmonics from the signal at an output node 14. The 100 gHz test signal at the output node is applied to a contact pad or transmission line structure of a device or an integrated circuit under test (not shown) for purposes of testing and characterizing the device or the circuit. The output node is shown in FIG. 2 at 16. The node 16 represents a metalization pattern which is formed on the RF signal conductor 14 for purposes of making contact with a device or an integrated circuit.

Typically, the input impedance at approximately 20 gHz looking into the coaxial connector of 12 of the active probe is 50 ohms, and the characteristic impedance at approximately 100 gHz looking into the output node 14 of the active probe is also 50 ohms. The reason for choosing these impedances is that characteristic impedance of coaxial cable, connectors and input/output impedances of typical integrated circuits are generally 50 ohms. Thus, the characteristic input impedance of the active probe at the frequency of the input signal should also be 50 ohms for maximum power transfer from the coaxial cable to the structures on the active probe 10. Also, test signals are normally injected into a 50 ohm coplanar waveguide formed on the surface of the device or integrated circuit under test. Therefore, the characteristic impedance looking into the output node 14 of the active probe should also be 50 ohms at the frequency of the output signal, approximately 100 gHz, for best power transfer from the active probe to the device or integrated circuit under test.

To use the active probe 10 shown in FIGS. 1 and 2, a signal source capable of generating a test signal of approximately 20 gHz is coupled to the coaxial connector 12 by 50 ohm coaxial cable. This 20 gHz input signal is coupled to the unit coplanar waveguide line and the frequency multiplier section on the surface of the active probe 10 and is converted to a 100 gHz test signal for output at node 14. This test signal is then injected into the proper node of an integrated circuit under test by contacting the metalization pattern 16 in FIG. 2 to the appropriate contact pad of the integrated circuit.

The active probe is constructed on a substrate 18 of insulating material. In the preferred embodiment, this substrate is alumina with an isotropic dielectric constant of 9.9 and is 125 microns thick. However, in alternative embodiments, any insulator with an isotropic dielectric constant of approximately 10 and having the same thickness of 125 microns will suffice as long as the other dimensions of the structure are such that the desired electrical characteristics detailed herein may be obtained. Those skilled in the art will appreciate that 50 ohm characteristic impedance uniplanar transmission lines may be constructed using other dimensions or other configurations. In such alternative embodiments, substrate materials having different thicknesses and dielectric constants could conceivably be chosen.

The structure of the coplanar waveguide of the active probe includes two groundplanes 20 and 22 separated by a gap 24 through which runs an RF signal conductor 26. These two groundplanes and the RF signal conductor are photolithographically etched from a metalization layer which is deposited upon the surface of the substrate 18. This metalization layer is approximately 1 micron thick in the preferred embodiment. There is no backside metalization. In the preferred embodiment, the metalization layer is principally gold with a thin layer of titaniumtungsten alloy formed over the gold for adhesion purposes.

The RF signal path of the active probe 10 is divided into several segments. The first segment is a 50 ohm coplanar waveguide comprised of the RF signal conductor 26, the insulating gaps 24 and the groundplanes 20 and 22 as well as the substrate 18. This coplanar waveguide has a first width in a first segment and a second narrower width in a second segment starting at 28. The second segment narrows proportionally at 28 such that all dimensions are reduced so as to retain their same relative sizes.

Figure 7:
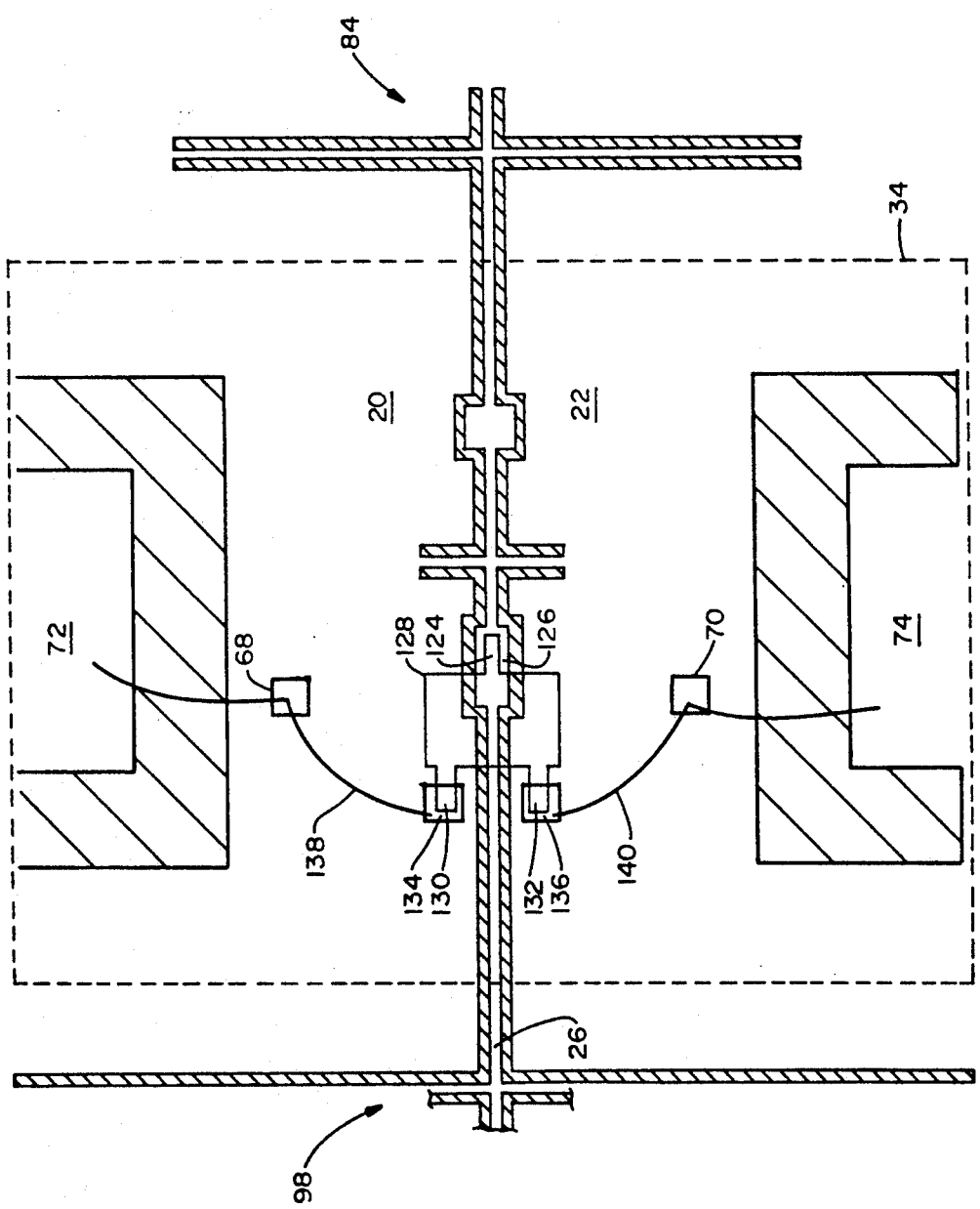
FIG. 7 is scale drawing of the diode nonlinear element section.

A low-pass filter segment has an input at 30 in FIG. 1. This low-pass filter output is at 32. An input impedance matching section has an input at 32. A pair of antiparallel, beam-lead diodes are bonded to the substrate at 34 which is the output of the input impedance matching section. These beam-lead diodes have D.C. bias connections to two D.C. input lines 36 and 38. These D.C. bias lines are coupled to the center pins of coaxial connectors 40 and 42 by gold bond wires 44 and 46. Likewise, the center conductor of the coaxial connector 12 is connected to the RF signal line 26 by a gold bond wire or ribbon 48. The ground or shield terminals of the coaxial connectors 40, 12 and 42 are electrically connected to a metal mounting bracket 50 having mounting holes 52, 54 and 56 for purposes of physically securing the mounting bracket to a semiconductor wafer probing station. The metal of this mounting bracket 50 is electrically connected to the groundplanes 20 and 22 by conductive epoxy 58 and 60. The D.C. bias conductors 36 and 38 run along the surface of the substrate in insulating gaps 60 and 62 formed in the groundplane metalization. Each of the D.C. bias conductors has gold bond wires which connect the conductors to one terminal of the diodes and to one or more chip capacitors which are bonded to the groundplane to form a low-impedance path to ground for high frequency RF signals. Wires 64 and 66, respectively, are examples of such gold bond wires which, in the embodiment shown, couple the D.C. bias conductor to chip capacitors, 68 and 70, respectively. These chip capacitors are essentially parallel plate capacitors formed by metalization of opposing surfaces of a dielectric substrate. One metalized surface of the capacitor is then bonded to the groundplane by conductive epoxy and the opposite surface is bonded to the gold bond wire. Each of these chip capacitors is coupled to a D.C. bias contact pad, 72 and 74, respectively, by a gold bond wire in the illustrated embodiment. Other embodiments are possible, and one such alternative embodiment is illustrated in FIG. 7. Gold wires 76 and 78 couple the capacitors to the pads. Each of the D.C. bias contact pads 72 and 74 is coupled to a terminal of one of the antiparallel beam-lead diode pair by one of the gold bond wires, 80 or 82.

An output impedance matching section is shown generally at 84 having its input coupled to the shared node of the diode pair and having an output. The purpose of this output impedance section is generally to couple as much energy as possible at the fifth harmonic out of the diodes and to short the third harmonic. A further purpose is to reflect the input signal back toward the diodes.

Finally, a bandpass filter section 86 coupled to the output of the output impedance matching section and to the output node 14. The purpose of the bandpass section is to filter out all but the desired fifth harmonic.

In FIG. 3, there is shown a block diagram of the filter and matching sections of the frequency multiplier circuit according to one embodiment of the apparatus of the invention which has been successfully tested in the laboratory. There are, however, other alternative preferred designs for the various filter and impedance matching sections which are contemplated by the inventors to have better electrical characteristics according to the criteria set out below.

The frequency multiplier section of the active probe receives the input signal at node 30. The purpose of the low-pass filter 88 is to pass the input signal frequency (approximately 20 gHz) but to reject any other higher frequencies propagating in either direction. The low-pass filter 88 exhibits an input impedance of 50 ohm at the input frequency at terminal 30. This permits maximum power transfer from the transmission line 26 into the low-pass filter. The low-pass filter is designed to have a cutoff frequency just slightly above the maximum frequency of the input signal. In the preferred embodiment, the cutoff frequency for the low-pass filter would be approximately 25 gHz. The low-pass filter 88 should also reject all higher harmonics of the input signal frequency. Ideally, the low-pass filter would exhibit an impedance at terminal 32 looking toward the input terminal 30 which is substantially near zero at the frequency of the third harmonic and substantially infinite at the frequency of the fifth harmonic. However, this is not critical if the output impedance of the input impedance matching section to be described below exhibits these characteristics at the frequencies of the third and fifth harmonics. Also, the output impedance of the low-pass filter should be substantially near zero for all harmonics higher than the fifth harmonic to suppress these frequencies. Thus, any third harmonic signal which reaches node 32 traveling toward the input 30 will be suppressed by what is essentially a short circuit. Likewise, any fifth harmonic energy reaching node 32 traveling toward the input 30 will be reflected toward the output 14 by the essentially infinite impedance seen at that frequency at node 32. It is desirable for the transfer function of the low-pass filter 88 to be essentially flat over the band of input frequencies of interest.

In the embodiment shown in FIG. 3, the structure of the low-pass filter is implemented using segments of coplanar waveguide/transmission line to conduct the signal from input 30 to output node 32. These segments are coupled to 4 stubs of coplanar waveguide which are terminated in open circuits and which, together with the line segments, provide the desired capacitive and inductive reactances to obtain the filter characteristics defined above. In the symbology used in FIG. 3, stub lines 90, 92, 94 and 96 should be interpreted as depicting four coplanar waveguide stubs terminated in open circuits. A pseudo-scale drawing (perhaps distorted by the photoreproduction process) of the low-pass filter section 88 and all the other impedance matching and filter sections is shown in FIG. 6. The dimensions of the various segments of transmission line and the gap widths are given on FIG. 6 in microns. The dimensions of the various structures define the electrical characteristics. More specifically, the width and thickness of the RF signal conductors, the gap widths, the separation of the various stub lines, the dimensions of the stub line center conductors and their gap widths to the groundplane, and the length of the stub and line segments in addition to the thickness of the metalization, and the thickness of the substrate and its dielectric constant are the design parameters by which the desired electrical characteristics of any particular filter or impedance matching section may be set. Those microwave engineers who are familiar with the design principles of uniplanar and coplanar waveguides and who are familiar with the synthesis of filters using discrete components and who are familiar with the process of converting from lumped filter design to distributed filter design by way of the Richards transformation and the Kuroda identities (both of which are in the literature) will be fully enabled to recreate any of the embodiments given herein or to design other filter and impedance matching sections which have even better electrical characteristics for this application. There are many possible topologies for the design of the various filter and impedance matching sections which can satisfy the electrical requirements given here. Any topology which satisfies the electrical requirements given here will suffice for purposes of practicing the invention. The embodiment of FIG. 3 has been laboratory tested and is known to work. Guidance as to the desired electrical characteristics for each section will be given herein for purposes of enabling those skilled in the art to make their own designs for each section.

The purpose of the input impedance matching network is to transform the 50 ohm characteristic impedance at the output 32 of the low-pass filter at the frequency of the input signal to the input impedance of the antiparallel diode pair 34 at the frequency of the input signal. It is desired to obtain maximum power transfer into the diode pair 34 at the frequency of the input signal to maximize the power of the fifth harmonic generated in the diodes. The input impedance matching network 98 has the additional function of suppressing the third harmonic and reflecting the fifth harmonic toward the output 14. Specifically, the input impedance matching network 98 should have an input impedance at node 32 at the frequency of the input signal which is the complex conjugate of the low-pass filter output impedance at node 32, i.e., approximately 50 ohms. At the input 100 to the diodes, the impedance looking into the input impedance matching network 98 should be substantially near zero at the frequency of the third harmonic and at the frequencies of the harmonics above the fifth harmonic so that these harmonics are suppressed by what is essentially a short circuit. However, the impedance at node 100 for energy at the fifth harmonic frequency which is traveling toward the input 30 should be substantially infinite or high enough to substantially reflect all this energy toward the output 14. In the preferred embodiment, substantially all of the fifth harmonic energy will be reflected toward the output 14 by the impedance at node 100. Thus, it will not be necessary to design the low-pass filter 88 to reflect fifth harmonic energy reaching node 32 with the output 14. The input impedance matching network in the embodiment shown in FIG. 3 is comprised of a single coplanar waveguide segment 102 coupled to two coplanar waveguide stubs 104 and 106 which are terminated in short circuits.

The diode pair 34 serves to provide the nonlinearity which implements the frequency multiplier function. The purpose of the diode pair is to receive the input signal at approximately 20 gHz and generate a plurality of harmonics of this frequency by conducting the input signal to ground through the nonlinear equivalent circuit of the diodes. Because this diode pair has a nonlinear voltage-to-current characteristic, the harmonics are generated. The diodes are connected in antiparallel fashion so that the I-V characteristic relating voltage across the junctions to current through the junctions is as shown in FIG. 4. It can be shown through a Taylor series expansion of the exponential function shown in FIG. 4 that only odd-numbered harmonics are generated from the symmetrical structure of the diode pair shown in FIG. 3. This is because of the symmetry of the structure. FIG. 5 is a symbolic diagram of the spectrum of frequencies generated by the nonlinearity of the diode pair. The intensities of the various harmonics are only symbolically shown in FIG. 5. The actual intensities or power levels of each harmonic will be defined by the various coefficients of the terms of the Taylor series expansion and the embedding circuit.

Each diode in the diode pair 34 is coupled to RF signal ground through at least one capacitor. Capacitors 68 and 70 are examples of such capacitors. Likewise, each diode is coupled to a D.C. bias line 64 or 66. The purpose of the capacitors is to block flow of D.C. current to ground but to provide a low-impedance path to ground for high frequency signals. D.C. bias may be applied to the diodes through these wires and the RF signal conductor 26 so as to individually bias each diode to electrically match the diodes. The reason for this matching is to substantially completely cancel generation of all even harmonics. In practice, when using the active probe, the D.C. bias to each diode can be changed while observing the intensity of the various harmonic frequencies generated by the diodes. The D.C. bias is changed until the minimum amount of even harmonic signal energy is observed. In embodiments where integrated diodes having matching characteristics or other matched diodes are used, the D.C. bias connection is not necessary.

In the preferred embodiment, the capacitors 68 and 70 are each comprised of one or more chip capacitors which are spaced along the gold bond wire path from the connectors 36 and 38 to the diodes 34. The number of capacitors used for each capacitor symbolized by blocks 68 and 70 depends upon the operating frequencies. It is important to provide a very low-impedance path to ground for both the input frequency and the fifth harmonic thereof. The reason two capacitors are used in the preferred embodiment is that the capacitance of the chip capacitors is limited, and since it is necessary to insure that a sufficiently low-impedance path to ground will be provided for frequencies on the order of 20 gHz, two chip capacitors in parallel are used. By keeping the impedance of the path to ground for this frequency low, the maximum amount of current at this frequency is passed through the diode pair nonlinearity thereby increasing the intensity of the harmonic energy which is generated.

It is desirable that the junction capacitance of the diodes in the diode pair 34 be quite small so as to not present a virtual short across the diode junction for very high frequency signals. It is preferred that this junction capacitance be less than 0.02 picofarads. It is also desirable that the series resistance of the diodes in the diode pair be less than 10 ohms. The reason for this is to maximize the amount of fifth harmonic signal which is generated while minimizing dissipative losses. Greater intensity for the 100 gHz test signal output is always desirable to minimize signal-to-noise ratio problems in the characterization of the chip under test. It is also important that the inductance of the leads which conduct current to the diode junctions be as small as possible. This lead inductance represents a reactance which increases with increasing frequency thereby decreasing the amount of high frequency current flowing through the diode junction and decreasing the intensity of fifth harmonic energy generated by the diode pair. For the foregoing reasons, commercially available beam-lead diodes which are integrated on gallium arsenite substrate are preferred. Such diodes are available at least from Hewlett Packard Company of Santa Rosa, Calif.

The purpose of the output impedance matching network 84 is to match the output impedance of the diode pair 34 at the frequency of the fifth harmonic for maximum power transfer of fifth harmonic signal out of the diodes. In addition, the output impedance matching network 84 serves to suppress the transmission to the output 14 of the input signal and undesired harmonics such as the third harmonic and harmonics higher than the fifth. Typically, the output impedance matching network 84 has an input impedance at node 102 which is the complex conjugate of the output impedance of the diodes 34 at the frequency of the fifth harmonic. However, the impedance at the node 102 at the frequency of the third harmonic should be substantially near zero or as low as possible to suppress this harmonic before it reaches the output 14. The input impedance at node 102 at the frequency of the fundamental or input signal should be substantially infinite or as high as possible to reflect all energy at the frequency of the input signal back toward the diode pair 34.

As shown in FIG. 3, the output impedance matching network is comprised of four open circuit stub transmission lines 106, 108, 110 and 112. In addition, two stub transmission lines 114 and 116 having short circuit terminations are employed. Ideally, the impedance at node 118 for the output impedance matching network at the frequency of the fifth harmonic is approximately 50 ohms.

The final filter section in the active probe is a bandpass filter 86. The purpose of this filter is to transmit the fifth harmonic signal to the output node 14 and dissipate or reflect all other signals having frequencies outside the pass band of the bandpass filter. Ideally, the bandpass filter 86 should have a band width which encompasses the range of frequencies surrounding approximately 100 gHz which are to be used and should have a transfer function or filter attenuation characteristic which is substantially flat over the frequency band of interest. Also, the bandpass filter should have an input impedance at node 118 which is the complex conjugate of the output impedance of the output impedance matching network 84 at the frequency of the fifth harmonic. The bandpass filter should also have an output impedance at output node 14 which is substantially near 50 ohms.

Referring to FIG. 6 there is shown a pseudoscale model of the frequency multiplier section of the active probe (caution to the reader-the original scale may have been distorted in the photographic reproduction process to print this patent). The length and width dimensions in microns of each conductor are marked on the drawing near the corresponding segment. All gap widths are 25 microns. The substrate thickness is 125 microns with an isotropic dielectric constant of 9.9. The metalization gold with a Titanium-tungsten overcoat and a total thickness of 1 micron. Those skilled in the art, however, can easily envision other topographies for the filter and impedance matching sections which will have improved electrical characteristics over the topography shown in FIG. 6 so as to better meet the criteria given for each section as given in the above description of FIG. 3. In FIG. 6 the stub transmission lines which have short black segments connecting the black pair of lines representing gaps defining each segment represent an open circuit termination for that particular stub line. Likewise, the stublines which have two black lines terminating at the end of the stub with no connection between the two black lines represent a short circuit termination to the groundplane. The groundplane is the white area surrounding the entire structure shown in FIG. 6. The white area inside the black lines represents the RF signal conductor of the frequency multiplier section of the active probe. As noted above, the stub transmission lines together with the interconnecting line segments are used to provide appropriate inductive and capacitive components for each filter and impedance matching section to define its impedance and attenuation characteristic. Note that the structure of FIG. 6 shows a plurality of shorting wires such as the wire 120 which connect the two halves of the groundplane on either side of RF signal transmission line 26. These shorting wires are used to suppress even coplanar waveguide modes which could be transmitted along the two halves of the groundplane. That is, the two halves of the groundplane 20 and 22 can transmit energy from one end of the probe to the other if variations in potential between the two halves of the groundplane are allowed. The multiple shorting wires such as the wire 120 tie the two halves of the groundplane together at a plurality of locations thereby preventing any voltage potential difference from existing between the two halves of the groundplane. This prevents transmission of any energy in a spurious mode involving the groundplanes.

The desired mode of transmission through the active probe is the quasi-TEM mode. Any discontinuities can result in scattering of energy into other undesired modes. For this reason it is desirable to minimize any discontinuities to prevent such scattering.

Referring to FIG. 7 there is shown a scale drawing of the diode section assembly at a substantially larger scale than has heretofore been shown. The embodiment shown in FIG. 7 is slightly different than the embodiment shown in FIG. 1 in the placement of the chip capacitor 68 and 70. As noted earlier these two chip capacitors are in fact four capacitors wired in parallel. The RF input signal is coupled to the shared node 124 of the antiparallel pair diodes at a contact pad 126. This input signal at approximately 20 gHz then propagates to ground through the junctions of the beam-lead diodes. These diodes are shown at 128 schematically as a simple three terminal block. The individual terminals of the two diodes at 130 and 132 are coupled, respectively, to a terminal of each of the two chip capacitors 134 and 136. Each of these chip capacitors has its other terminal coupled to the groundplane 20 or 22 by conductive epoxy. The second set of chip capacitors, 68 and 70, are located between the beam-lead diodes 128 and a pair of D.C. bias contact pads 72 and 74. These chip capacitors each have one terminal which is bonded to the groundplane 20 or 22 by conductive epoxy and each has a second terminal. Two gold wires, 138 and 140, are wire bonded between the second terminals of chip capacitors 68 and 70 and chip capacitors 134 and 136. These four chip capacitors are therefore parallel paths to ground for the high frequency RF signals but block signals at D.C. In alternative embodiments, the D.C. bias lines may be omitted if matched diodes are used or if filter sections are available which can adequately suppress the undesired harmonics including even harmonics which will result if the diodes are not evenly matched.

The structure of the active probe described herein has the important advantage of using readily available high power microwave sources to provide the input signal to drive the nonlinear device. Interfacing between the microwave source and the probe input is implemented over a broad bandwidth with a low-loss coaxial to coplanar waveguide transition. The microwave signals are multiplied to the appropriate millimeter-wave frequency, and the probe is contacted directly to the input pad of the device under test thereby supplying the test signal. Electrooptic sampling can then be used to measure input/output and internal node parameters of the device under test. Electrooptic sampling is well known in the literature and is described in an article by Weingarten, Rodwell and Bloom entitled "Pico Second Optical Sampling of Gallium Arsenide Integrated Circuits", IEEE Journal of Quantum Electronics, Volume 24, No. 2, February 1988, pp: 98–220.

In alternative embodiments, other forms of planar transmission media such as microstrip transmission lines may be used. One of the major advantages of coplanar and uniplanar waveguides over microstrip transmission lines at millimeter-wave frequencies is the existence of ground conductors on the same plane as the signal conductors. This class of transmission lines is sometimes also referred to as uniplanar transmission lines. The advantage of uniplanar waveguide is that short connection paths between circuit elements maybe realized with resulting low dissipative and reactive parasitic impedances and without the need for via holes. Characteristic impedance of coplanar waveguide is also less sensitive to substrate thickness variations compared with microstrip transmission lines.

In designing uniplanar waveguides circuits, care must be taken to avoid excitation of undesired modes. To suppress the even modes in coplanar waveguide circuits for the active probe, gold bond wires are used instead of air bridges to reduce circuit fabrication complexity. However, in alternative embodiments, air bridges may be used. It is also important to avoid major discontinuities in the design of the coplanar waveguide to avoid exciting undesired modes. Such discontinuities involved an abrupt change in the dimensions of the center conductor or gap spacings. These changes give rise to changes in the electric and magnetic field distribution that can be represented by an equivalent capacitance and equivalent inductance. The discontinuities are then characterized by evaluating these capacitances and inductances. The types of discontinuities present in the design of the active probe described herein are the step in the center conductor width, the step in gap spacing and the cross junctions at the location of the stubs. Although at low frequencies these discontinuities typically cause only very small perturbations of signal propagation, at millimeter-wave frequencies the effects are not negligible. The effects of these discontinuities were evaluated using microstrip discontinuity models since coplanar waveguide discontinuity models are not currently available in microwave circuit simulation programs.

The diodes in the preferred embodiment are stacked Schottky-barrier diodes fabricated on gallium arsenide. Each Schottky diode consist of two parallel fingers, each ten micrometers long. The input impedance of the diodes for the input frequency band of 15 to 20 gHz is calculated under a large signal drive by signal of the same frequency. The output port of the diodes is assumed to be open circuit at the fundamental frequency, which is a good approximation considering the relatively large out-of-band rejection of the output filter. The output impedance at 75 to 110 gHz (fifth harmonic frequency) is calculated with an input signal at the fundamental frequency. Since the circuit is nonlinear, this impedance is a function of the load presented to the diodes at the fifth harmonic output frequency.

The filters of the active probe were designed based upon doubly-terminated, lumped, low-pass prototype filters. The terminating impedance on both ports were chosen to be 50 ohms. The coplanar waveguide filters were further optimized using TOUCHSTONE TM software.

The input filter was designed to provide low insertion loss for the pass band and to provide rejection of the odd harmonics of the pass band, in particular the fifth harmonic. The circuit was fabricated on an alumina substrate using thin film deposition and lift-off of sputtered tantalum-gold followed by additional gold plating to reduce skin effect loses. One mil diameter gold wire was used to connect the groundplane at multiple locations on the two sides of the center conductor to suppress even modes.

PREFERRED EMBODIMENT OF A FREQUENCY MULTIPLIER PROBE

Figure 8:
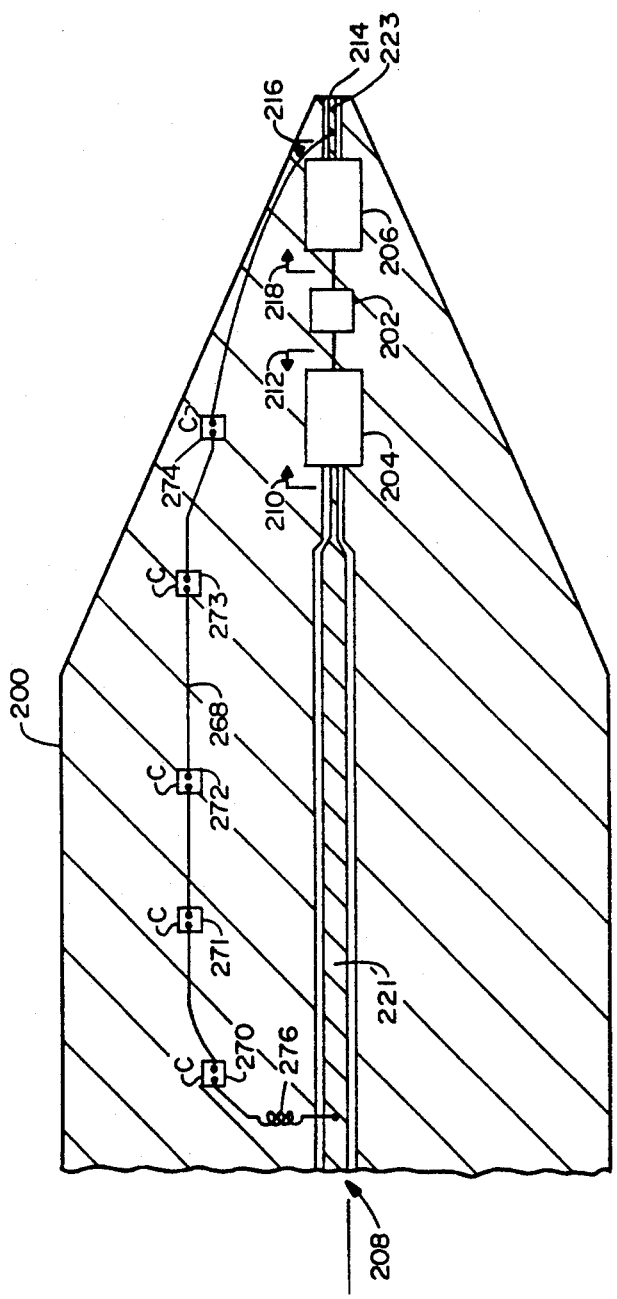
FIG. 8 is a plan view of a generic embodiment of the preferred frequency multiplier integrated circuit test probe.

Referring to FIG. 8, there is shown a plan view of the generic embodiment of the preferred frequency multiplier integrated circuit test probe. The probe is comprised of a substrate 200 which has dimensions suitable for interchangeability with test probe bodies for any selected commercially available integrated test probe on the market. There are at least two alternative constructions for the frequency multiplier of FIG. 8. These are: a hybrid construction; and a fully integrated construction.

In the hybrid construction configured as a probe, the substrate 200 is ceramic, i.e., alumina, and beam-lead diodes or other semiconductor junction devices such as transistors can be used for the nonlinear element 202. A low-pass filter and impedance matching section 204 and a bandpass filter and impedance matching section 206 provide the desired impedance characteristics and frequency response to cause the appropriate harmonics to be output and other undesired harmonics to be suppressed. In the preferred embodiment, both these filter and impedance matching sections are comprised of a plurality of electrically coupled segments of coplanar waveguide which have dimensions so as to establish predetermined characteristic impedance and frequency response characteristics. In alternative embodiment, these filters may have other constructions so long as the structures chosen are compatible with the planar nature of the probe of FIG. 8 and have the desired impedance and frequency characteristics.

In the preferred embodiment, the predetermined desired impedance characteristics are as follows. The low-pass filter and impedance matching section 204 has a characteristic impedance of approximately 50 ohms at the frequency of the input test signal arriving at the probe input 208, hereafter sometimes called the fundamental frequency. This characteristic impedance is seen in the filter section 204 regardless of whether the fundamental frequency signal is propagating in the filter in the direction of arrow 210 or in the direction of arrow 212. Typically, the input test signals have a frequency of from 16-25 gHz. For purposes of discussion, a frequency of 20 gHz will be called the "fundamental" frequency herein.

The low-pass filter section 204 is also designed to have a characteristic impedance of substantially near a short circuit for the third harmonic of the fundamental frequency, and substantially near an open circuit for the fifth harmonic of the fundamental frequency when looking into the filter in the direction of the arrow 212. This causes the third harmonic of the fundamental frequency to be suppressed in the low-pass filter, and causes the desired fifth harmonic, hereafter sometimes referred to as the output signal, to be reflected toward the probe output at 214. Preferably, the higher order harmonics such as the seventh and ninth harmonics are also suppressed. The harmonics are generated at the location of the nonlinear element 202 and propagate both toward the probe output 214 and toward the probe input 208. It is not critical to the invention whether the undesired harmonics are suppressed reactively in the low pass filter or the bandpass filter so long as they are suppressed reactively.

The bandpass filter and impedance matching section 206 can be any design which has a characteristic impedance of 50 ohms at the fifth harmonic of the fundamental frequency looking into the filter in the direction of arrow 218. Likewise, the bandpass filter section 206 should have a characteristic impedance of substantially near 50 ohms for signals having the frequency of the fifth harmonic when looking into the filter section 206 in the direction of the arrow 216. Likewise, the filter section 206 should be designed so as to have a characteristic impedance of substantially near a short circuit for frequencies at or near the seventh harmonic of the fundamental frequency so as to suppress the propagation of these harmonics toward the output 214. In alternative embodiments, the low-pass filter section 204 may have a characteristic impedance low enough to suppress propagation of the seventh harmonic and the bandpass filter section 206 may have a characteristic impedance low enough to suppress propagation of the third harmonic.

Any discrete or fully integrated filter design which satisfies the above defined characteristic impedance criteria will suffice for purposes of practicing the invention, as long as the design is compatible with the coplanar waveguide nature of the probe of FIG. 8.

Figure 9:
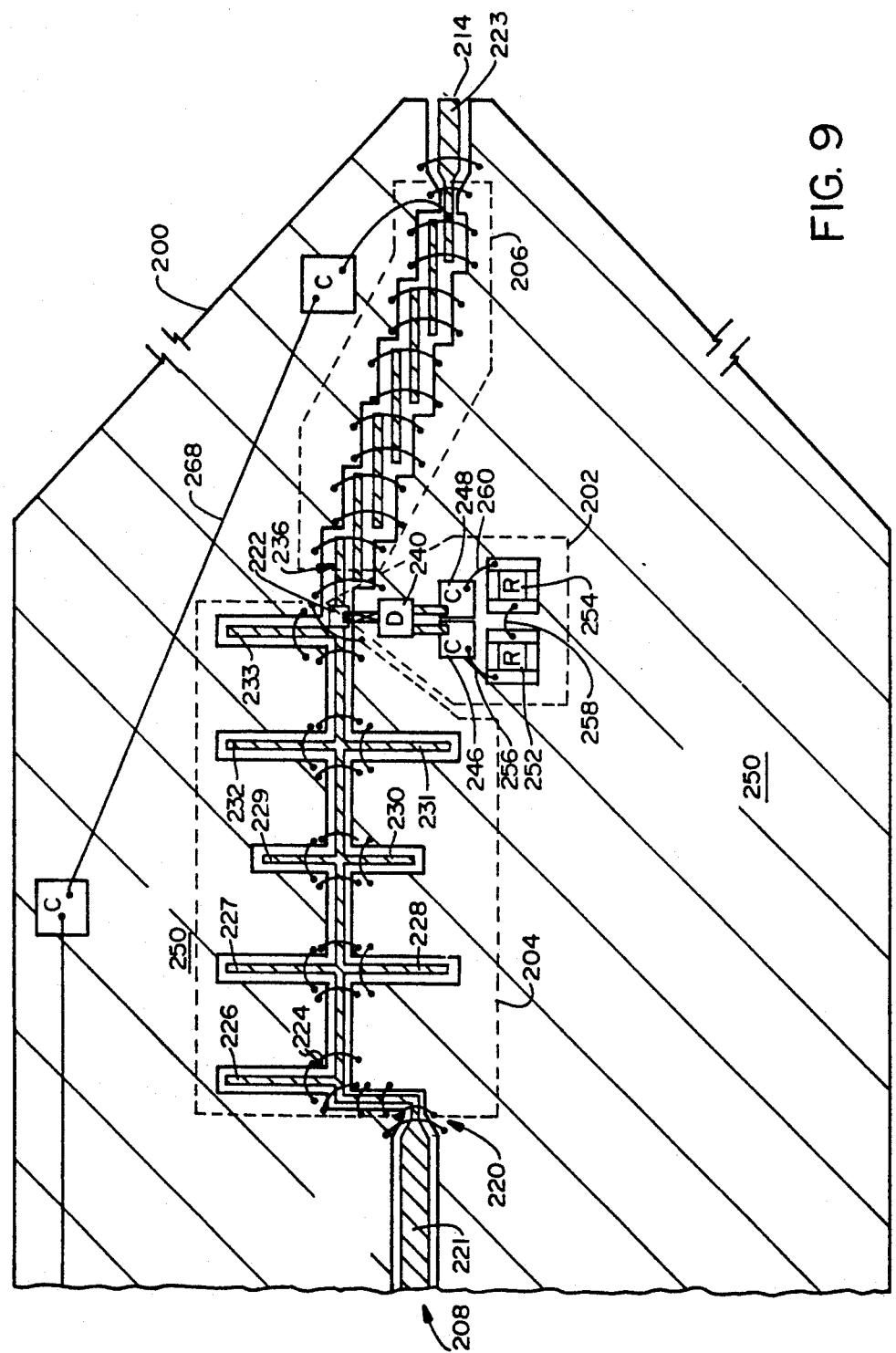
FIG. 9 is a plan view of the layout of the preferred form of hybrid construction of a frequency multiplier probe.

The preferred hybrid construction embodiment of the probe of FIG. 8 is shown in FIG. 9. The low-pass filter section 204 has a low-pass filter input at 220 which is coupled to a coplanar waveguide 221 having a characteristic impedance substantially near 50 ohms at the fundamental frequency. The low-pass filter section also has a low-pass filter output at 222 which is sometimes referred to as a node in the claims appended hereto. This node 222 represents the electrical coupling between the low-pass filter section 204 and the bandpass filter section 206. It also represents the electrical coupling point to the diode section 202.

The cross-hatched structures in FIG. 9 represent conductive material formed on the surface of a ceramic substrate 200. The blank portions of the figure in the gaps between the cross-hatched structures represent insulating gaps of bare ceramic. The large expanses of conductive material on either side of the center conductor 221 of the coplanar waveguide represent the groundplane structure 250 of the coplanar waveguide 221. The arcing lines between dots on the two segments of the groundplane, such as the arcing line shown at 224, represent bond wires which electrically connect the two halves of the groundplane together to maintain an equal potential between the two halves of the groundplane to suppress undesired even modes of propagation.

The low-pass filter section 204 in FIG. 9 has the characteristic impedance parameters defined above with respect to the discussion of FIG. 8. This filter is comprised of a plurality of segments of coplanar waveguide which are electrically coupled and which are loaded at various locations with open circuit coplanar waveguide stubs 226-233. By open circuit, it is meant that the center conductors of these coplanar waveguide stubs do not electrically contact any portion of the groundplane conductors.

Likewise, the bandpass filter section 206 has the characteristic impedance parameters defined above with respect to the discussion of FIG. 8. The filter section 206 is comprised of a plurality of coupled-line coplanar waveguide circuits. One pair of these coupled-line coplanar waveguide circuits is shown at 236. Basically, each segment of center conductor in the pair is approximately one-quarter wavelength long at the frequency of the output signal at output 214 and is adjacent to and parallel with the other stub in the pair. Since the frequency multiplier of FIG. 9 is designed to multiply the fundamental input frequency by a factor of 5 and output the fifth harmonic, each stub in the coupled-line coplanar waveguide circuits such as the one shown at 236 is one-quarter of the wavelength of a 100 gHz signal. When 100 gHz signals propagate down a series of coupled-line coplanar waveguide circuits sized such as these, there is electrical coupling between the isolated but adjacent stubs. This coupling occurs because of the capacitance between the two conductors caused by their proximity. By cascading several such coupled-line coplanar waveguide circuits of differing dimensions, the desired frequency response and desired characteristic impedance at various frequencies can be synthesized in a manner well known in the art of filter synthesis. The filter synthesis process for coupled-line filter design is described in a book entitled *Microwave Filters, Impedance-Matching Networks and Coupling Structures*, by Matthei, Young and Jones, published by McGraw-Hill, New York, 1964. Filter synthesis for the low-pass filter section 204 may be done by any of the known methods described in the literature, as may the synthesis of the bandpass filter 206.

Although use of the particular structures shown in FIG. 9 is preferred, their use is not critical to the invention. It is only necessary that the characteristic impedance parameters described with reference to the discussion of FIG. 8 be achieved, and any filter configuration which achieves these characteristic impedance parameters will suffice for purposes of practicing the invention.

Figure 10:
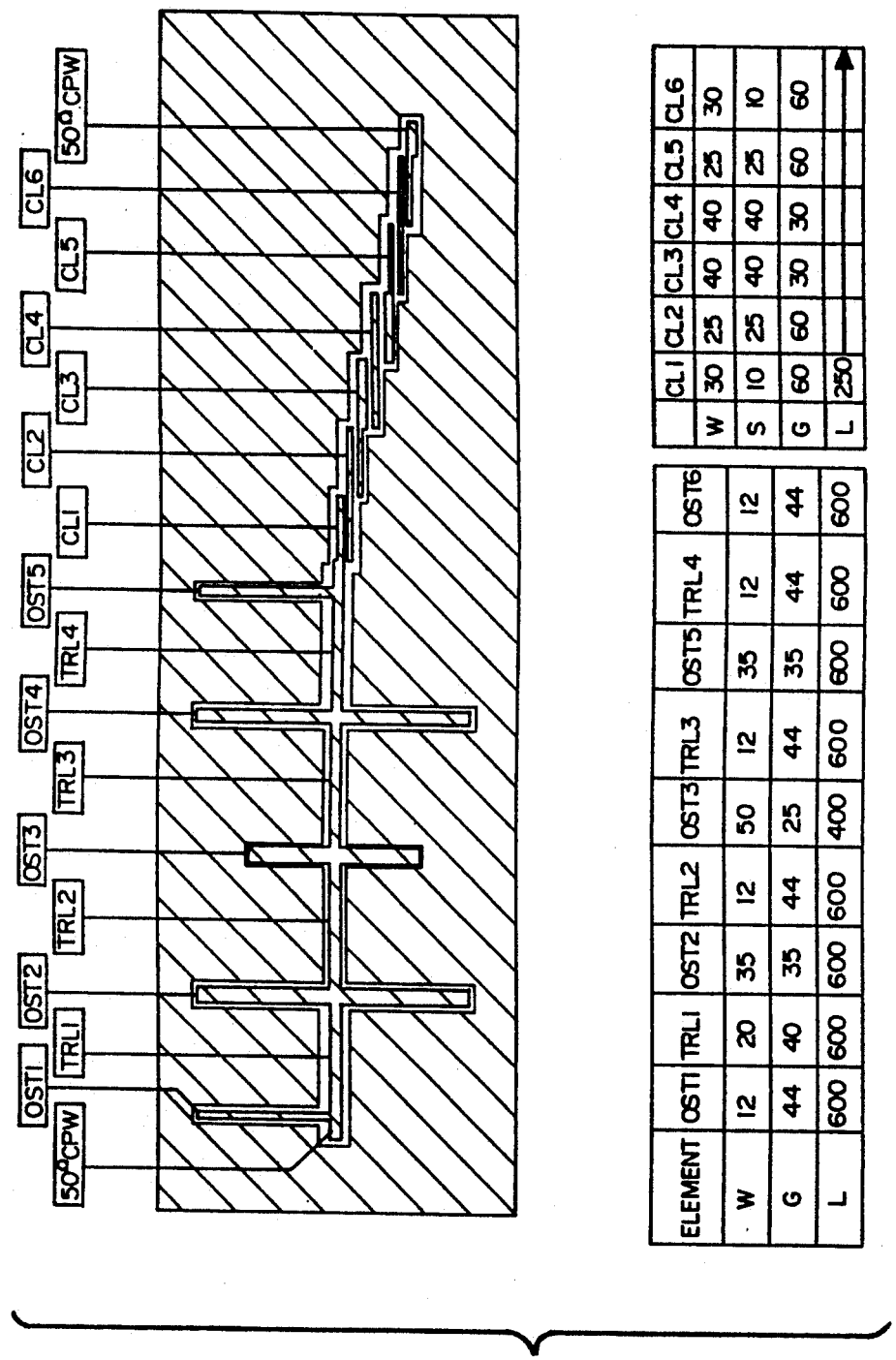
FIG. 10 gives the dimensions for the filter sections of the frequency multiplier probe.

FIG. 10 gives the specific dimensions for the various structures shown in FIG. 9.

Figure 11:
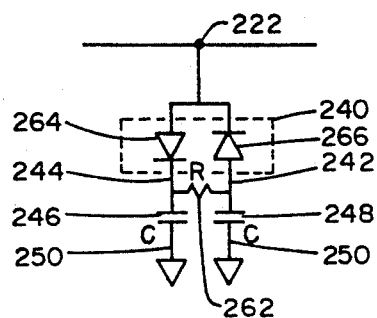
FIG. 11 is the schematic diagram of the diode section 202 in FIG. 9.
Figure 12:
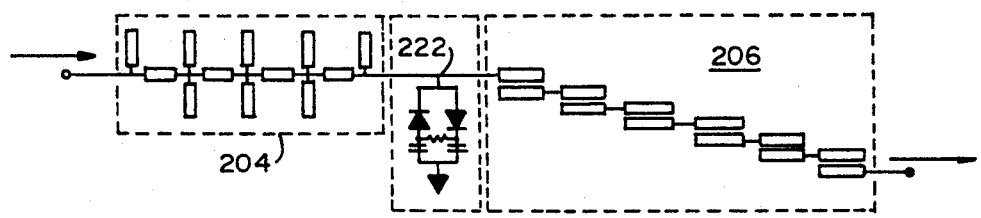
FIG. 12 is the schematic diagram of the overall frequency multiplier probe preferred embodiment.

The diode section 202 in FIG. 9 incorporates a pair of antiparallel connected, Schottky, gallium arsenide, beam-lead diodes, with two chip capacitors, and two chip resistors. The electrical circuit implemented by the diode section 202 is as shown in FIG. 11. The overall electrical circuit for the probe of FIG. 9 is shown schematically in FIG. 12. The beam-lead diodes have one beam lead coupled to the node 222 and the other two beam leads, corresponding to terminals 242 and 244 in FIG. 11, coupled, respectively, to the top plates of chip capacitors 246 and 248. The chip capacitors have a top plate and a bottom plate of conductive material which are separated from each other by insulating material. The bottom plates of both capacitors is in electrical contact with the ground plane 250 and the top plates are in contact with the diodes. Two chip resistors 252 and 254 are connected in series by bond wires 256 258 and 260 to complete a resistors shown at 262 in FIG. 11. This resistor 262 completes a path for D.C. current generated by the rectification by diodes 264 and 266 of A.C. signals appearing at node 222. The purpose of the capacitors 246 and 248 is to provide a shunt low-impedance path for high-frequency signals to the groundplane 250.

The junction capacitance and series resistance of the diodes, as well as the capacitance of the capacitors 246 and 248 and the resistance of the resistor 262 are all taken into account in the overall frequency response and characteristic impedance calculations for signals at the various frequencies so as to yield the characteristic impedance parameters defined above with reference to the discussion of FIG. 8. In the preferred embodiment, the diodes are commercially available from Hewlett Packard and have junction capacitances of 20 femtofarads with a series resistance of 6-8 ohms. These diodes have cut-off frequencies above 700 gHz. The resistor 252 has a value of 50 ohms, while the resistor 254 has a value of 100 ohms in the preferred embodiment. These resistors are also commercially available. The capacitors 246 and 248 are ceramic capacitors having capacitance of 5 picofarads, and are commercially available from Dielectric Labs of New York. The value of these capacitances must be such as to provide a good A.C. ground at both low and high frequencies. The beam leads of the diodes 240 provide not only support but electrical connection for the diodes.

Finally, for purposes of providing D.C. bias to the device under test, which is in electrical contact with the output node 214, a D.C. bias line is provided at 268. This wire-bonded conductor 268 couples the output node 214 to the input node 208 to provide a D.C. bias path. This is best seen in FIG. 8. This D.C. bias line is periodically shunt loaded by individual chip capacitors 270–274 and has a series inductor 276. The purpose of the shunt capacitors and series inductor is to filter out any high frequencies so as to allow only D.C. signals to propagate along line 268 from the input to the output.

Figure 13:
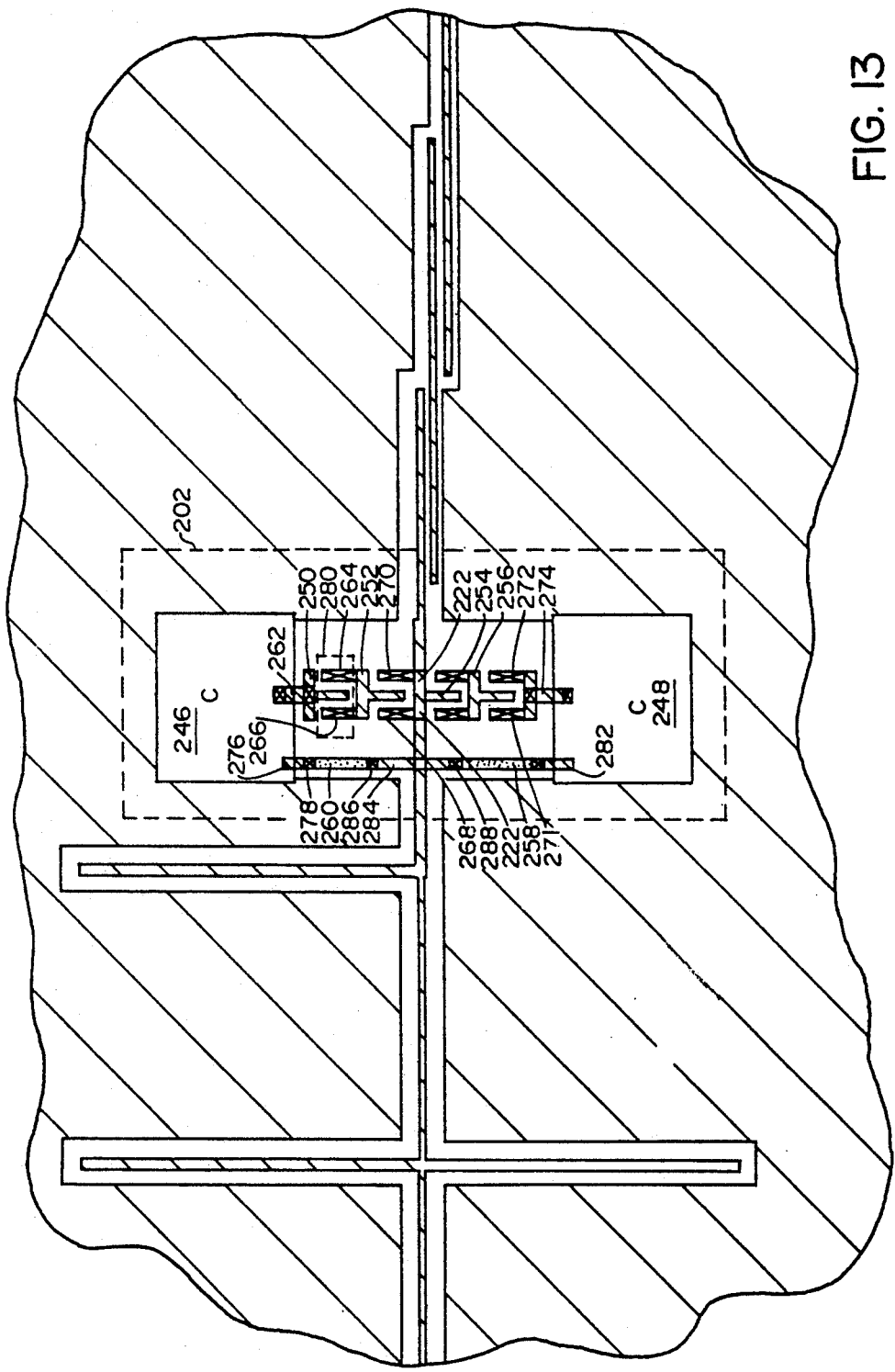
FIG. 13 is a fully integrated structure for the preferred embodiment of the frequency multiplier.

Referring to FIG. 13, there is shown a fully integrated version of the preferred embodiment of the frequency multiplier probe using diodes as the nonlinear element. Other semiconductor junction devices such as transistors could similarly be used as the nonlinear element. Only the diode section 202 is shown in full in FIG. 13, since all the other structures are identical to that shown on FIG. 9. The capacitors 246 and 248 and the diodes 250, 252, 254 and 256 all have the same structure and are constructed using the same process as defined in copending U.S. patent application Ser. No. 259,027, filed Oct. 17, 1988 entitled "GALLIUM ARSENICE MONOLITHICALLY INTEGRATED SAMPLING HEAD USING EQUIVALENT TIME SAMPLING HAVING A BANDWIDTH GREATER THAN 100 gHz", by Rob Marsland, Mark Rodwell and David Bloom, the disclosure of which is hereby expressly incorporated by reference. Similarly, epitaxial layer resistors 258 and 260 and the air bridges connecting various ones of the just-identified structures have the same structure and are constructed in the same way as described in the above identified patent application.

The capacitors 246 and 248 are thin-film capacitors using the groundplane as one plate of the capacitor and a metallic film separated from the groundplane by an insulating film of silicon nitride as the top plate of the capacitor. The capacitor 246 is coupled by an air bridge 262 to the anode of integrated Schottky diode 250. The cathode of diode 250 is Schottky metal and forms ohmic contacts 264 and 266 from the anode of Schottky diode 252 to the underlying N+ epitaxial layer in the substrate. The junction of all the integrated diodes is the interface between an N− doped epitaxial layer and the Schottky metal of anode contacts. Underlying the N− doped epitaxial layer is an N+ doped epitaxial layer. The ohmic contacts of all the diodes contact the underlying N+ doped epitaxial layer.

The cathode of Schottky diode 252 is coupled by ohmic contacts 268 and 270 to the node 222 and is also the Schottky metal anode 254 of the Schottky diode 254. The cathode of Schottky diode 254 is coupled by ohmic contacts to the anode of Schottky diode 256. Ohmic contacts 271 and 272 couple the cathode of the Schottky diode 256 via an air bridge 274 to the top plate of the capacitor 248.

The top plate of the capacitor 246 is coupled via an air bridge 276 and an ohmic contact 278 to a resistor 260 formed in the underlying N+ doped epitaxial layer beneath the surface of the substrate. The substrate in the structure shown in FIG. 13 is gallium arsenide. The epitaxial layer resistors 260 an 258 are formed in the N+ doped epitaxial layer by ion bombardment of the areas surrounding the area to form the resistor path thereby causing sufficient ion damage to render these areas insulating as opposed to semiconducting. Ohmic contacts are then formed at each end of the resistor path to complete the resistor construction.

Ion bombardment is also used to define the active junction areas for the diodes in the epitaxial layers. That is, all the areas around the diodes, except for the immediate junction underneath the Schottky anode contacts are ion bombarded to convert these areas of semiconductor into insulating material. A typical active junction area is shown by dashed line 280 with the areas outside the dashed line being ion bombarded to convert them to insulating material. The epitaxial layer resistor 258 is coupled to the top plate of the capacitor 248 by an air bridge 282.

The term "top plate" as it is used herein indicates the electrode of the capacitors which is not in physical contact with the groundplane. This terminology convention applied not only to capacitors 246 and 248 but to all the other capacitors shown in the various figures.

The two epitaxial layer resistors 260 and 258 are connected together by an air bridge 284 and ohmic contacts 286 and 288.

The use of two diodes in series with a capacitor to form a shunt path to the groundplane in FIG. 13 is designed to double the height of the Schottky barrier.

The integrated nature of the structure shown in FIG. 13 reduces the parasitic inductances and capacitances which result from the use of bond wires and beam leads in the structure shown in FIG. 9. Therefore, the embodiment shown in FIG. 13 has a higher performance level.

The antiparallel nature of the diode connections shown in FIG. 13, as in the structures shown in FIGS. 8–12, are preferred since these antiparallel diode arrangements have symmetric current-voltage characteristics. This results in symmetric waveform distortion and suppression of generation of even harmonics. This feature is useful in the design of broad-band odd-order frequency multiplier probes. However, in alternative embodiments, single diodes may be used, thereby providing asymmetric waveform distortion. This causes the generation of both odd and even harmonics, which makes the filter synthesis task more difficult since more undesired harmonics must be suppressed. It is basically necessary to design the filters so as to suppress all undesired harmonics to prevent them from reaching the output while selecting the desired harmonic and presenting a characteristic impedance of 50 ohms from the point of the diode to the output for that harmonic while presenting an essentially infinite impedance to propagation of that harmonic back toward the input. Further, an essentially infinite input impedance must be presented at the node 222 looking toward the output node to propagation of the fundamental input signal. However, if such filters can be synthesized, it is within the scope of the invention to use alternative diode arrangements in the frequency multiplier probe.

Figure 14:
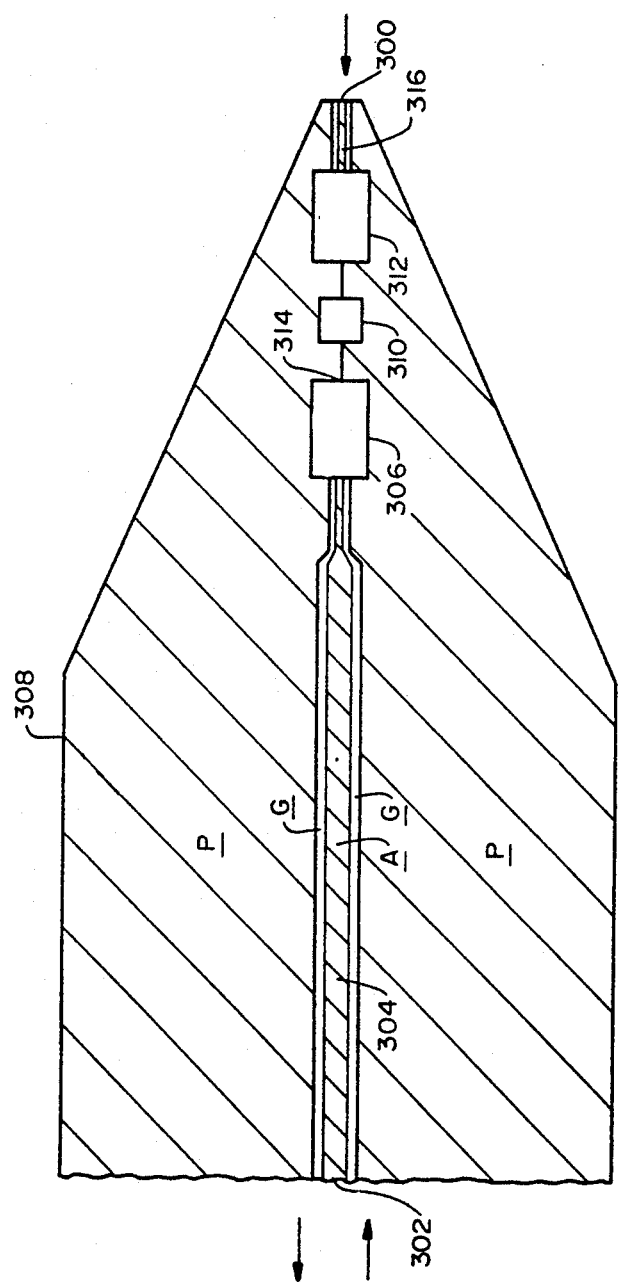
FIG. 14 is a plan view of a generic version of the preferred embodiment of a harmonic probe mixer.

Referring to FIG. 14, there is shown a plan view generic form of the preferred embodiment of a hybrid harmonic mixer integrated circuit active probe. The purpose of this probe is to contact a device or an integrated circuit at an input node 300 and receive high-frequency millimeter-wavelength signals from the device or the integrated circuit. These high-frequency signals are converted to a lower frequency and output at an input/output node 302. These output signals are called the intermediate frequency signals. The node 302 is called an input/output node because it both outputs the intermediate frequency signals and receives local oscillator signals. Harmonics of the local oscillator signals are mixed with the input signals received at node 300 to generate the intermediate frequency signals. The local oscillator signals are guided to the location of an nonlinear circuit 310 where the mixing occurs, by a 50 ohm characteristic impedance coplanar waveguide 304. This coplanar waveguide is coupled to a low-pass filter and impedance matching circuit 306. Likewise, the coplanar waveguide 304 guides the intermediate frequency signals from the low-pass filter 306 back to the input/output node 302.

The coplaner waveguide 304 is comprised of a center conductor A and two groundplanes P separated from the center conductor A by two insulating gaps G. This structure is fabricated on a substrate 308 which is ceramic in some embodiments and gallium arsenide semiconductor in other embodiments.

The other components of the harmonic mixer probes in FIG. 14 are a nonlinear circuit 310, which is a pair of antiparallel connected diodes and a shunt capacitor in the preferred embodiment but which could also be other semiconductor junction devices such as transistors, and a high-pass filter and matching circuit 312. The shunt capacitor couples the input node 314 of the low-pass filter to the groundplane P. In the preferred embodiment, the diode circuit 310 includes two antiparallel diodes forming a series connection between the high-pass filter 312 and the low-pass filter 306. That is, one of the diodes has its anode coupled to the low-pass filter 306 and its cathode coupled to the high-pass filter 312, while the other diode has its cathode coupled to the low-pass filter 306 and its anode coupled to the high-pass filter 312. In some embodiments, these diodes are gallium arsenide beam-lead diodes. In other embodiments, these diodes are gallium arsenide Schottky diodes integrated in a gallium arsenide substrate. These various structures will be described in more detail below.

The exact structure of the low-pass and high-pass filters 306 and 312, respectively, is not critical to the invention as long as the structures chosen are compatible with the planar nature of the probe shown in FIG. 14 and have the impedance characteristics given below at the frequencies of interest. Specifically, the frequencies of interest include an input RF frequency on the order of 100 gHz and a local oscillator frequency which is substantially close to 5 gHz. Consequently, the intermediate frequency will be the difference between the 20th harmonic of the local oscillator frequency and the input RF frequency and will be much lower in frequency than either the input RF signal or the intermediate frequency signal.

The low-pass and high-pass filters have the following impedance characteristics in the preferred embodiment. The high-pass filter 312 should present a characteristic impedance of approximately 50 ohms to the input RF signals traveling in the filter 312 in either direction. The coplanar waveguide 316 also should provide a characteristic impedance of 50 ohms to input RF signals having a frequency on the order of 100 gHz traveling in either direction along the waveguide. Further, the high-pass filter 312 should present an impedance which is substantially near a short circuit for local oscillator signals and intermediate frequency signals propagating from the diode circuit 310 toward the input node 300.

In the preferred embodiment, the antiparallel nature of the diode circuit 310 causes only odd-order harmonics of the local oscillator signal to be generated, while only even-order mixing products are generated. Also, in the preferred embodiment, the low-pass filter 306 provides an impedance which is substantially near a short circuit for the third, fifth and seventh harmonics of the local oscillator signal propagating from the diode circuit 310 toward the input/output node. This effectively suppresses propagation of these harmonics in any direction since they "see" a short circuit looking into the node 314. Also the high-pass filter 312 should be designed to pass only the input RF signals and to provide substantially near a short circuit impedance to the third, fifth and seventh harmonics of the local oscillator signal. Higher order harmonics above the seventh harmonic are also desirably suppressed by having both of the filters 306 or 312 providing an impedance which is substantially near a short circuit for signals at these higher frequencies. Generally, these higher order harmonics are of a magnitude such that suppression of them is desirable, but not critical to the invention.

Generally speaking, then, it is desirable to have the impedance characteristics of the low-pass and high-pass filters 306 and 312 such that the input RF signals see a 50 ohm input impedance at node 300 and at the input of the filter 312 and are guided to the diode circuit 310 but do not reach the input/output node 302 by virtue of seeing a substantially zero input impedance at the node 314 so as to be reflected back toward the diode circuit 310. Also, the local oscillator signals are received at node 302 and see an input impedance of 50 ohms and are guided to the diode circuit 310. These local oscillator signals do not reach the input node 300. The desired mixing product, herein called the intermediate frequency signals, should then be guided back toward the input/output node 302 while seeing a characteristic impedance of 50 ohms with very little energy from the intermediate frequency signals reaching the input node 300. It is desirable, therefore, that the high-pass filter 312 provide a characteristic impedance which is substantially near a short circuit for the intermediate frequency signals so as to reflect most of this energy toward the input/output node 302.

In the preferred embodiment, the physical dimensions of the substrate 308 are such as to be interchangeable with the probe bodies of commercially available passive integrated circuit test probes. In the hybrid structure embodiments to be described below, the substrate is a 5-mil thick alumina substrate with titanium-gold metalization and 1-micron gold plating as a conductive layer from which the coplanar waveguide 304 and 314 are formed. The structure of coplanar waveguides 304 and 316 are similar to the coplanar waveguides 221 and 223 in FIG. 9 but have dimensions which yield a characteristic impedance of 50 ohms for the frequencies which are propagating down these waveguides. These dimensions may be somewhat different from the dimensions of the coplanar waveguides 221 and 223.

Figure 15:
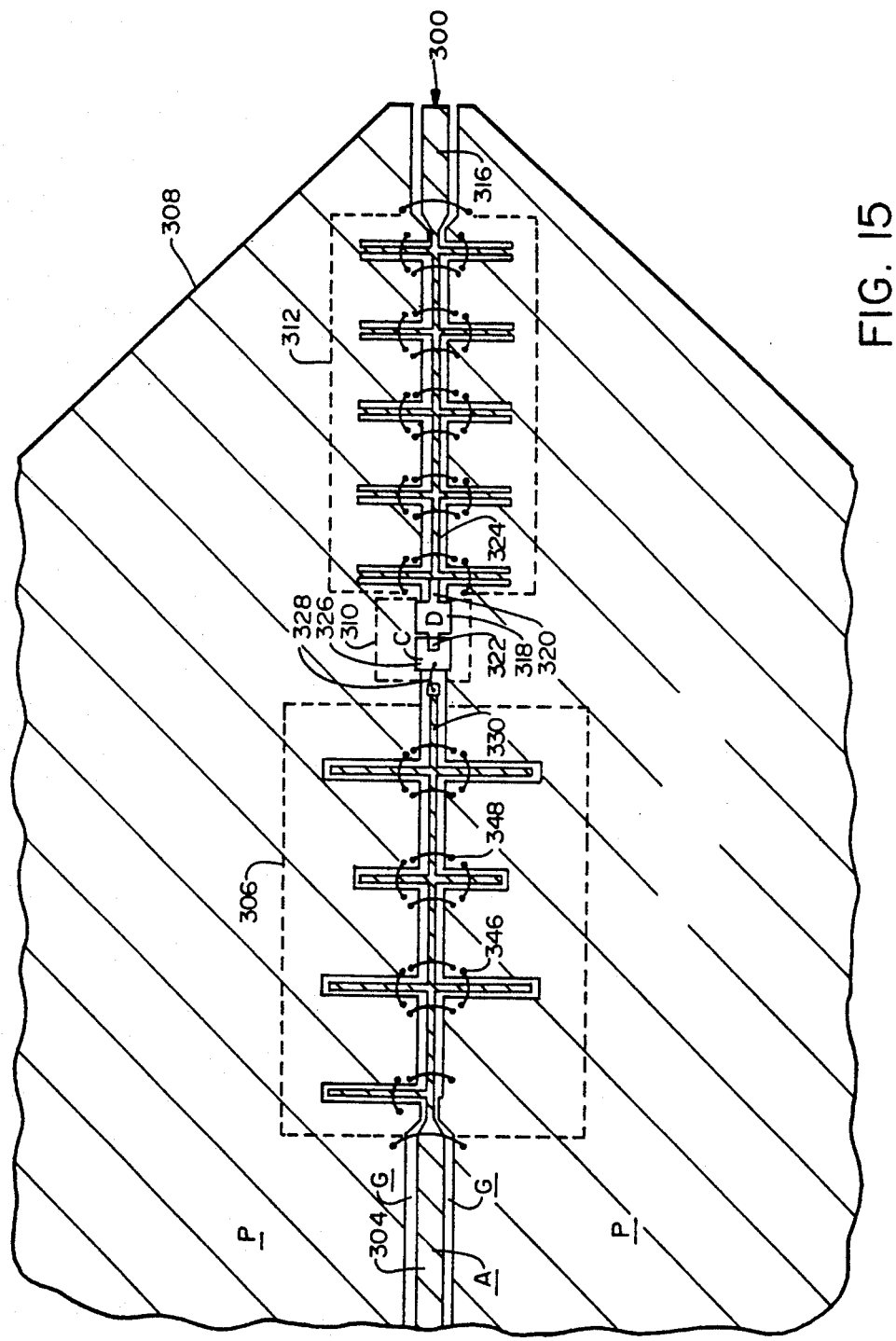
FIG. 15 is a plan view of a hybrid structure for a harmonic mixer probe according to the teachings of the invention.

Referring to FIG. 15, there is shown a more detailed plan view of a hybrid structure for the harmonic mixer probe of FIG. 14. It is seen from FIG. 15 that the low-pass filter section 306 is comprised of a series of electrically coupled segments of coplanar waveguide. The dimensions of the various coplanar waveguide segments are selected to give the impedance characteristics described above, with reference to the discussion of FIG. 14. There are many different alternative embodiments for designing a low-pass filter having the impedance characteristics described above, and any of these alternative embodiments will work for purposes of practicing the invention. However, one specific embodiment which is known to work is as shown in FIG. 15. The exact dimensions of the various structures are given in FIG. 16. The coplanar waveguide segments of the low-pass filter 306 in FIG. 315 are terminated in open circuits.

Figure 16:
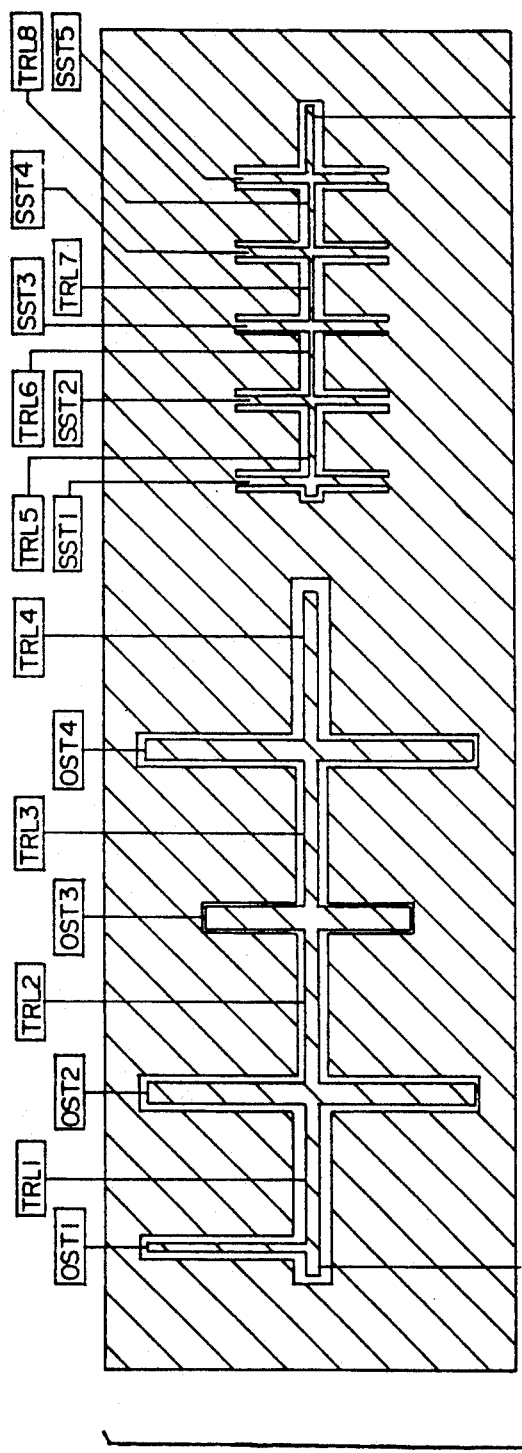
FIG. 16 gives the dimensions for the preferred embodiment of the low-pass and high-pass filter sections of the harmonic mixer probes.

The high-pass filter section 312 in FIG. 15 is also comprised of a plurality of electrically coupled coplanar waveguide segments, the exact dimensions of which are also given in FIG. 16. In contrast to the situation for the low-pass filter 306, the coplanar waveguide segments of the high-pass filter 312 are terminated in short circuits to the groundplane P.

The diode circuit 310 is comprised of a pair of Schottky, gallium arsenide, antiparallel, beam-lead diodes 318. The antiparallel diodes form the circuit shown in FIG. 17 and have two common nodes. One of these common nodes is connected to the beam lead 320 while the other common node is connected to the beam lead 322. These beam leads provide both electrical contact and mechanical support for the diodes 318. The beam lead 320 is coupled to the center conductor 324 of the main coplanar waveguide segment of the high-pass filter 312. The beam lead 322 is coupled to the top plate of a chip capacitor 326 which has its bottom plate electrically coupled to the groundplane P. The capacitor 326 provides a shunt path for RF signals to the groundplane. The top plate of the capacitor 326 is also coupled by a bond wire 328 to the center conductor 330 of the main coplanar waveguide segment of the low-pass filter 306.

Figure 17:
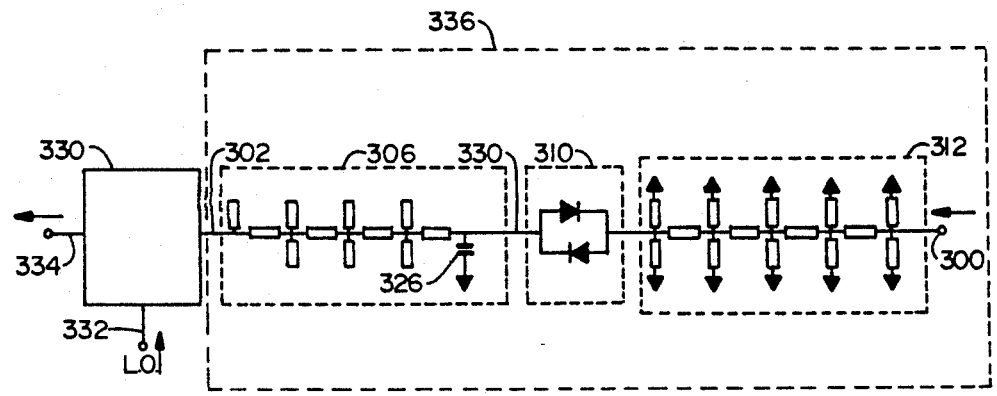
FIG. 17 is a schematic diagram for the preferred embodiment of the harmonic mixer probe.

Referring to FIG. 17, there is shown a schematic diagram for the circuit embodied in the structure of FIG. 15. The circuit of FIG. 17 shows clearly the antiparallel nature of the connections of the diodes within the diode circuit 310. In the diagram of FIG. 17 the triangular symbols at the end of the vertical coplanar waveguide segments in the high-pass filter 312 represent the short circuit terminations to the groundplane. Note also in the circuit of FIG. 17 that a diplexer circuit 330 is coupled to the input/output node 302. This diplexer circuit is commercially available from Hewlett Packard, and resides off the probe body. The purpose of the diplexer 330 is to receive the local oscillator signals on line 332 and guide them to the input/output node 302, and to receive the intermediate frequency signals at the input/output node 302 and guide them to an intermediate frequency output line 334.

Figure 18:
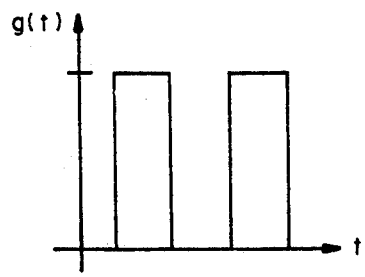
FIG. 18 is a diagram of the time domain conductance response of the diodes to the local oscillator drive signals in the harmonic mixer probe.
Figure 19:
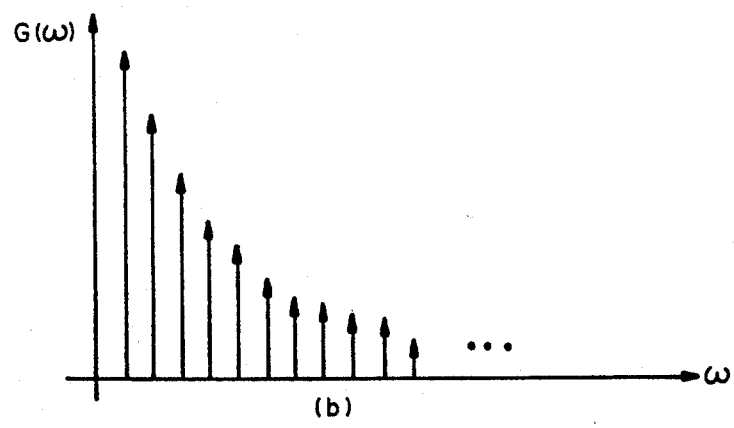
FIG. 19 is a frequency domain spectrum of the time domain waveform of FIG. 18.

Referring to FIG. 18, there is shown a time domain diagram of the conductive response of the diodes in circuit 310 of the harmonic mixer probe to the local oscillator signals. It is seen that the diodes rectify the local oscillator signal A.C. waveform to create a series of more or less rectangular pulses. The frequency spectrum of the waveform of FIG. 18 is shown in FIG. 19. FIG. 19 shows that there are many frequency components in the Fourier spectrum making up the time domain waveform of FIG. 18. It is these different frequency components which generate the harmonics and mixing products which generate the intermediate frequency signals which are output on line 334 of FIG. 17.

Figure 20:
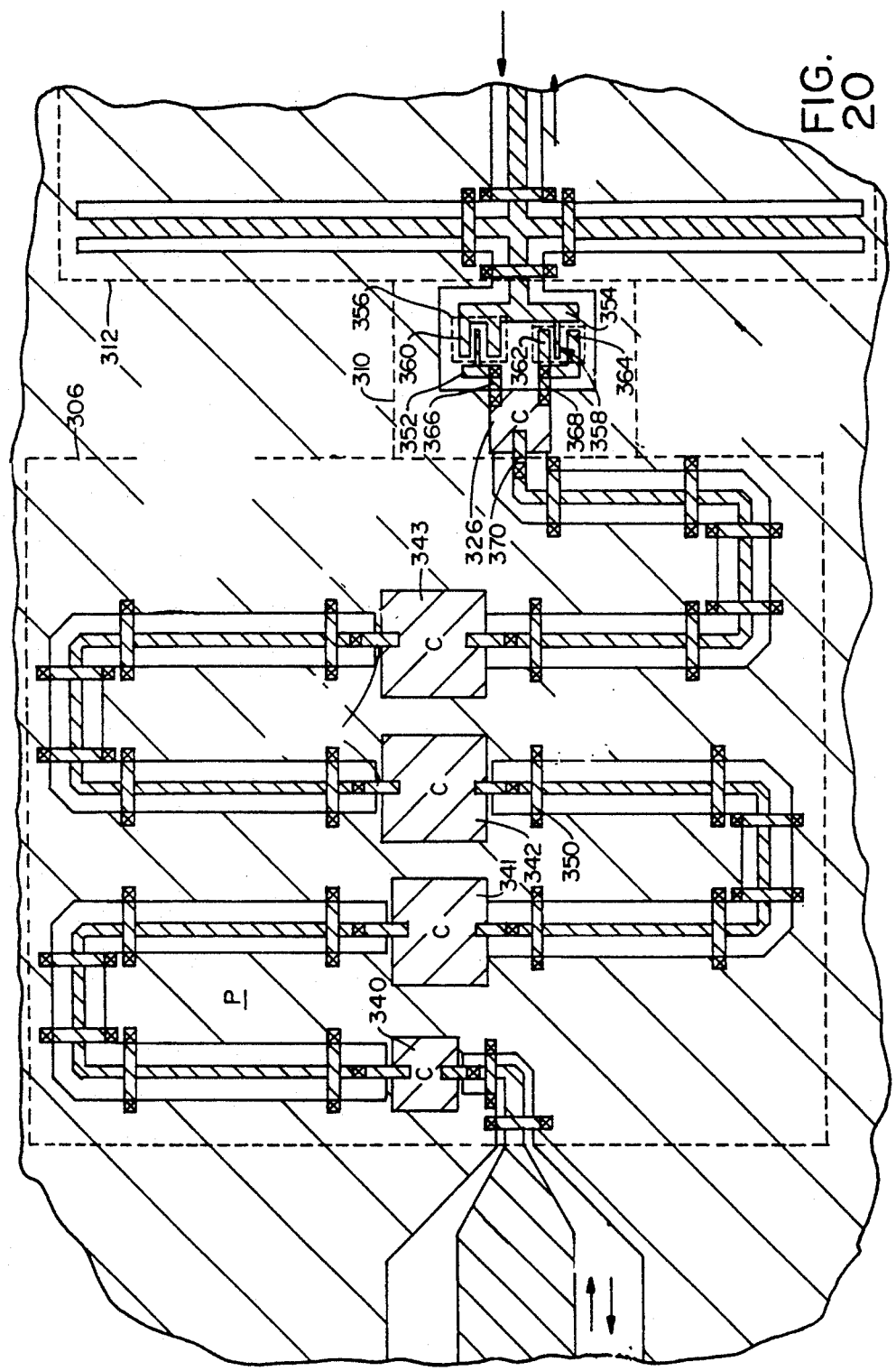
FIG. 20 is a fully integrated version of the harmonic mixer probe.

Referring to FIG. 20, there is shown a fully integrated embodiment of the harmonic mixer probe according to the teachings of the invention. The integrated structure shown in FIG. 20 illustrates one of the different options for the structure of a low-pass filter section 306. The low-pass filter of the embodiment shown in FIG. 20 is comprised of a plurality of integrated capacitors 340-343 interconnected by a serpentine pattern of coplanar waveguides. Each integrated capacitor has as its bottom plate the groundplane P and has as a top plate a metallic layer formed on top of an insulating layer which has been deposited on the groundplane P. Air bridges have been substituted for the bonded wires such as the wires 346 and 348 in FIG. 15 to minimize parasitic inductance and capacitance associated with the bond wires. The air bridges in FIG. 20 are represented by the symbol labeled "air bridge" and given the reference numeral 350 in FIG. 20. These air bridges are spaced along the length of the coplanar waveguide to insure that the two halves of the groundplane remain at equal potential at all points along the structure. The capacitors 340-343 all have the integrated structure described earlier herein.

The capacitor 326 is also of the integrated construction described above for the capacitors 340-343. The capacitors 326 and 340 both have a value of 0.35 pf. The capacitors 341 and 343 each have a value of 1.59 pf, while the capacitor 342 has a value of 1.98 pf in the preferred embodiment. The serpentine coplanar waveguide connecting the capacitors 340-343 and the capacitor 326 is sized to provide the same impedance at the various pertinent frequencies as the coplanar waveguide in the low-pass filter section 306 of FIG. 15. The advantage of the serpentine construction of FIG. 20 is that it consumes less chip area, which is important, since the structure of FIG. 20 is integrated on a gallium arsenide substrate.

In the preferred embodiment, a pair of antiparallel diodes are used as the nonlinear element. In other embodiments, other semiconductor junction devices such as transistors could be used as the nonlinear element. In the preferred embodiment, the diodes of the nonlinear circuit 310 are formed with Schottky diode contacts to a N— doped epitaxial layer formed in the substrate. An anode contact 352 of Schottky metal forms the Schottky diode junction for one of the diodes in the diode circuit 310, while an anode contact 354 forms the Schottky junction for the other diode in the diode circuit. The dashed lines 356 and 358 define the outer limits of the active junction area defined in the epitaxial layer. This active junction area is isolated on all sides by ion implant damage in the epitaxial layer. The cathode contacts of these diodes are formed by ohmic contacts such as the contact 360. The anode contact 352 of the top diode and the cathode contacts 362 and 364 of the bottom diode are coupled by air bridges 366 and 368, respectively, to the top plate of the capacitor 326. The capacitor 326 provides the shunt path for RF signals to the groundplane P. The top plate of the capacitor 326 is also coupled by an air bridge 370 to the center conductor of the serpentine coplanar waveguide of the low-pass filter circuit 306. The cathode contacts of the upper diode and the anode contact 354 of the lower diode are extensions of the Schottky metal of the center conductor of the coplanar waveguide in the high-pass filter section 312.

It can be understood by those skilled in the art by inspection of FIG. 20 that the teachings of the invention contemplate a class of structures for the filter sections 306 and 312, all of which may satisfy the various impedance criteria given earlier herein. Only some of these structures have been detailed herein, but those skilled in the art can appreciate other structures which will also implement the teachings of the invention.

Referring to FIG. 21, there is shown a diagram of an S-parameter active probe for making millimeter-wave on-wafer measurements of S-parameters of devices and integrated circuits. The concept of S-parameters can be best understood by simultaneous reference to FIG. 22 through 25. FIG. 22 illustrates a typical test setup for a device or an integrated circuit under test 400. Typically, the device or integrated circuit under test will have a test signal having a wavelength on the order of millimeters injected by a test probe 402. For millimeter-wave on-wafer S-parameter measurements, the probe 402 will be a probe of the type shown in FIG. 21. During the process of injection of test signals, there will be reflected power from the device under test 400 because of a mismatch of impedance between the output impedance of the probe 402 and the input impedance of the node of the device under test 400 contacted by the probe. The incident test signals are represented by the vector element $A_1$. The reflected energy is represented by the vector element $B_1$. There will also be energy transmitted through the device under test represented by $B_2$.

Typically, the probe 404 will also be a probe of the type shown in FIG. 21. The probe 404 will receive $B_2$, the transmitted signal through devices under test, when probe 402 is providing the injected signal $A_1$, in the so-called "forward mode." In the "reverse mode" the probe 404 will typically inject signals into the other port of the device under test represented by the vector element $A_2$. Further, there will be reflected and transmitted signals. These reflected and transmitted signals are represented by the vector quantities $B_2$ and $B_1$, respectively.

The vector equation of FIG. 23 represents the relationship between the S-parameters and the vector quantities A and B. The vector quantity A is comprised of the vectors $A_1$ and $A_2$ in FIG. 22, while the vector quantity B is comprised of vector quantities $B_1$ and $B_2$ of FIG. 22.

The two equations of FIG. 24 represent the exact relationships between the four S-parameters and each of the elements of the vector quantities A and B. It is seen from the equations of FIG. 24 that the vector element $B_1$ is comprised of the sum of the products of the S-parameter $S_{1,1}$ times the $A_1$ element of the A vector plus the product of the S-parameter $S_{1,2}$ times the $A_2$ element of the a vector. A similar relationship applies for the $B_2$ element of the B vector. FIG. 25 shows how the S-parameter $S_{1,1}$ can be expressed as a vector quantity in either polar coordinates or x-y coordinates.

The S-parameter active probe of FIG. 21 illustrates the preferred embodiment of a generic form of a test probe by which millimeter-wave devices and integrated circuits can be tested and characterized on-wafer as to their S-parameters. To measure S-parameters, it is necessary to know the incident power, the reflected power and the transmitted power at each port of a two-port circuit. The S-parameter active probe of FIG. 21 allows both the incident, the transmitted, and the reflected energy to be measured.

The S-parameter active probe of FIG. 21 has the following generic configuration. A substrate 406 is used as an integration platform for the probe. In other embodiments, the substrate 406 may be of a custom configuration and have its own custom-designed supporting structure. In the preferred embodiment, the substrate 406 is 5-mil thick alumina having a conductive coating of titanium-gold with 1-micron gold plating formed over one surface thereof. However in alternative embodiments, gallium arsenide or other dielectric substrates can be used.

A frequency multiplier 408 is formed on the substrate so as to receive input test signals propagating along a coplanar waveguide 410. Typically, these test signals have a frequency of approximately 20 gHz. The frequency multiplier section 408 multiplies the frequency of the incoming test signals by a factor of 5 and outputs signals having a frequency on the order of 100 gHz on a coplanar waveguide 412. These test signals are injected into the device under test which is in contact with an output node 414. A directional coupler 416 taps off a portion of the incident power propagating toward the device under test in the coplanar wave guide 412 and couples this tapped-off energy via a coplanar waveguide 418 to a harmonic mixer circuit 420. The harmonic mixer circuit 420 receives local oscillator signals at a port 422 and mixes the harmonics of the local oscillator signals with the tapped-off signal arriving on coplanar waveguide 418. The tapped-off signal on coplanar waveguide 418 typically has an intensity of about 10% of the intensity of the test signals propagating in the coplanar waveguide 412 toward the device under test. The mixing of the harmonics of the local oscillator signals and the tapped-off signals on coplanar waveguide 418 result in the generation of mixing product signals, one of which is designated the intermediate frequency signal. This signal is output at port 422 and is used to measure the parameter $A_1$ in FIG. 22.

Part of the incident energy applied to the device under test is reflected and propagates back along coplanar waveguide 412 toward the frequency multiplier section 408. A directional coupler 424 taps off a portion of this reflected energy and guides it along a coplanar waveguide 426 to a harmonic mixer circuit 428. The harmonic mixer circuit 428 also receives local oscillator signals injected at a port 430. These local oscillator signals are guided along a coplanar waveguide 432 to the harmonic mixer circuit 428 similarly to the guiding of the local oscillator signals arriving at port 422 by coplanar waveguide 434 to the harmonic mixer circuit 420. The harmonic mixer 428 mixes the 20th harmonic of the local oscillator signals arriving on coplanar waveguide 432 with the tapped-off portion of the reflected signals arriving on coplanar waveguide 426. Typically, the directional coupler 424 taps off approximately 10% of the energy of the reflected wave propagating toward the frequency multiplier 408 on coplanar waveguide 412. One of the mixing products generated by the harmonic mixer 428 is the desired intermediate frequency signal and represents the difference between the frequency of the local oscillator signal and the frequency of the tapped-off portion of the reflected signals. The intermediate frequency signals propagating to the left on coplanar waveguide 432 can be used to measure the vector element $B_1$ in FIG. 22.

The specific structures of the harmonic mixers 420 and 428 and the frequency multiplier 408 are preferably any of the structures described herein for the frequency multiplier and harmonic mixer probes. In alternative embodiments, substitutions of different structures for the filter elements or nonlinear elements of any of the frequency multiplier or harmonic mixer embodiments described herein may be made without departing from the teachings of the invention. Further, any structure for a harmonic mixer or frequency multiplier which is compatible with the coplanar waveguide nature of the probe of FIG. 21 and with the above-defined functioning of that probe may be used for purposes of practicing the invention.

Figure 26:
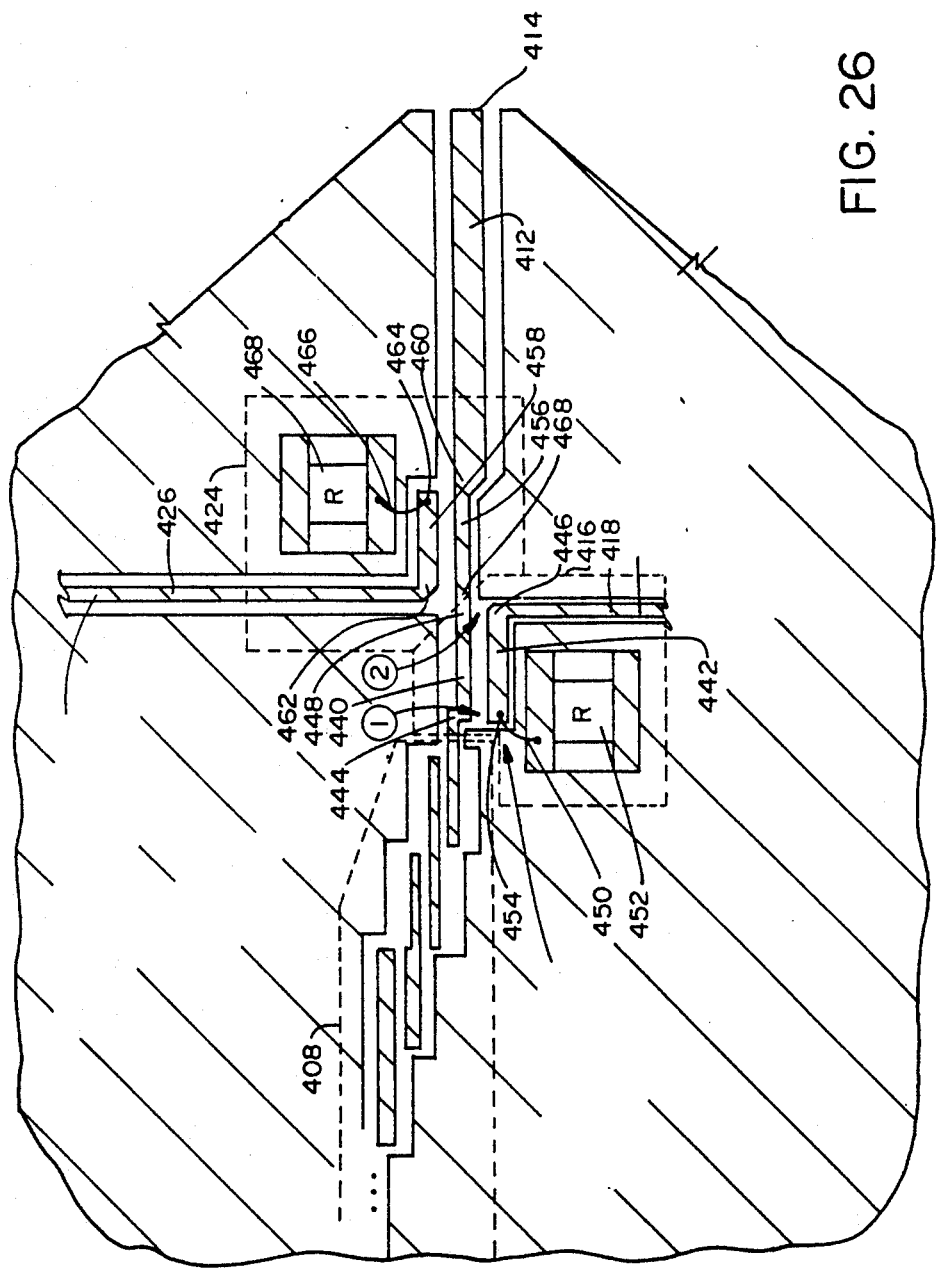
FIG. 26 is a plan view of the layout of the directional couplers of the probe design of FIG. 21.

Referring to FIG. 26, there is shown a plan view for the structure of the directional couplers 416 and 424 in the probe design of FIG. 21. The directional coupler 416 is comprised of a pair of integrated conductors 440 and 442 which are each one-quarter wavelength long relative to the wavelength of the 100 gHz test signals propagating in coplanar waveguide 412 toward the device under test in electrical contact with the output node 414. That is, the distance between the points labeled 1 and 2 in FIG. 26 is one-quarter of the wavelength of a 100 gHz signal. The directional coupler 416 has an input at 444 which is in contact with the output of the multiple pairs of coupled line sections of the frequency multiplier 408. The output of the directional coupler 416 for the tapped off signal is at point 446. The output 446 is coupled to the center conductor of a coplanar waveguide 418 which guides the tapped-off portion of the incident signal to the harmonic mixer 420 shown in FIG. 21. The opposite end of the conductor 440 at 448 is coupled to the center conductor of the coplanar waveguide 412 and passes the main portion of the energy of the 100 Ghz test signal to the device under test. The opposite end of the conductor 442 from the output 446 is conductor 442 is coupled by a bond wire 450 to a chip resistor 452. The chip resistor 452 provides a characteristic impedance of approximately 50 ohms between the end 454 of the conductor 442 and the groundplane P.

The structure of the directional coupler 424 is very similar to the structure of the directional coupler 416, except that the orientation is altered so as to tap off a portion of the reflected signal propagating in coplanar waveguide 412 to the left in FIG. 26. That is, the directional coupler 424 is comprised of two conductors 456 and 458 which are parallel and spaced apart and which are each one-quarter wavelength long relative to the wavelength of the reflected signals propagating in the coplanar waveguide 412. The input of the directional coupler 424 is the end of conductor 456 labeled by reference numeral 460. The output of the directional coupler 424 for the tapped off energy is the end 462 of the conductor 458. This output is coupled to the center conductor of a coplanar waveguide 426 and guides approximately 10% of the energy of the reflected wave to the harmonic mixer 428 in FIG. 21.

The details of the structures of the frequency multiplier and harmonic mixer sections is not given in FIG. 26 since the structural details of these other circuits may be seen by inspection of the other figures herein.

The opposite end of the conductor 458, labeled by reference numeral 464, is coupled by a bond wire 466 to a 50 ohm chip resistor 468 which terminates this end in a 50 ohm impedance. The opposite end of the conductor 456 from the input end 460, labeled by reference numeral 468, is coupled to the end 448 of the directional coupler 416.

Those skilled in the art may appreciate other structures for the directional couplers 416 and 424 in FIG. 21. Any directional coupler structure which can tap off a portion of the incident and reflected waves propagating in coplanar waveguide 412 in a repeatable and predictable manner will suffice for purposes of practicing the invention.

Although the invention has been described in terms of the preferred and alternative embodiments detailed herein, those skilled in the art will appreciate numerous modifications which may be made without departing from the true spirit and scope of the invention. All such modifications are intended to be included within the scope of the claims appended hereto.

What is claimed is:

1. A harmonic mixer active probe for receiving at an input signals at a first frequency from an integrated circuit and for mixing said input signals with an intermediate frequency signal to generate a second, lower frequency and outputting said second frequency signals at an output, comprising a substrate having a conductive groundplane formed on a surface thereof:

a low-pass filter formed on said substrate surface and coupled to said output, said low-pass filter having predetermined impedance characteristics at various frequencies;

a high-pass filter formed on said substrate surface and coupled to said input, said high-pass filter having predetermined impedance characteristics at various frequencies and including a plurality of electrically coupled coplanar waveguide segments formed of conductive material deposited on said substrate surface, at least one of said high-pass segments being terminated in a short circuit to said groundplane;

non-linear signal mixing means coupling said high-pass filter to said low-pass filter; and a capacitor coupled to said mixing means and to said groundplane.

2. The apparatus of claim 1 wherein said signal mixing means includes a first diode having an anode coupled to said high-pass filter and a cathode coupled to said low-pass filter, and a second diode having an anode coupled to said low-pass filter and a cathode coupled to said high-pass filter.

3. The apparatus of claim 2 wherein said capacitor couples the anode of said second diode and the cathode of said first diode to said groundplane.

4. The apparatus of claim 2 wherein said low-pass filter comprises a plurality of electrically coupled coplanar waveguide segments formed a conductive material deposited on said substrate surface.

5. The apparatus of claim 4 wherein said first and second diodes are gallium arsenide beam-lead diodes coupling said low-pass and high-pass filters by electrical connections between the beam leads of said diodes and at least one of said coplanar waveguide segment in each of said low-pass and high-pass filters.

6. The apparatus of claim 4 wherein said substrate is gallium arsenide and wherein said first and second diodes are integrated Schottky diodes formed using a doped epitaxial layer in said substrate, and wherein the electrical connections between the anode of said second diode and the cathode of said first diode to said low-pass filter are by air bridges, and wherein the electrical connection of said cathode of said second diode to said high-pass filter is by ohmic contact to said epitaxial layer, and wherein said electrical connection between said first diode and said high-pass filter is by Schottky contact to said epitaxial layer.

7. The apparatus of claim 4 wherein said substrate is gallium arsenide and wherein said low-pass filter is comprised of a plurality of capacitors integrated on said substrate and interconnected by a plurality of coplanar waveguide segments.

8. The apparatus of claim 7 wherein said first and second diodes are integrated Schottky diodes formed using a doped epitaxial layer in said substrate, and wherein the electrical connections between the anode of said second diode and the cathode of said first diode to said low-pass filter are by air bridges, and wherein the electrical connection of said cathode of said second diode to said high-pass filter is by ohmic contact to said epitaxial layer, and wherein said electrical connection between said first diode and said high-pass filter is by Schottky contact to said epitaxial layer.

9. A harmonic mixer active probe having an input node and an input/output node at which local oscillator signals are received and from which intermediate frequency output signals are output, comprising:

a substrate having at least one conductive groundplane formed thereon;

first filter means formed on said substrate and coupled to said input node for presenting a predetermined characteristic impedance to input signals at a first frequency propagating in either direction in said first filter means and for presenting an impedance which is substantially a short circuit for said local oscillator signals propagating in said first filter means toward said input node, said first filter means including a first plurality of electrically coupled coplanar waveguide segments formed of conductive material deposited on said substrate wherein at least one of said first filter segments is terminated in a short circuit to said groundplane;

second filter means formed on said substrate and coupled to said input/output node and to said first filter means for providing a first characteristic impedance to said local oscillator signals propagating in said second filter means either toward said input node or toward said input/output node, and for providing said first characteristic impedance to said intermediate frequency signals propagating in said second filter means toward said input/output node, and for providing an impedance which is substantially a short circuit for predetermined harmonics of said local oscillator signal and for said input signals propagating toward said input/output node, said second filter means including a second plurality of electrically coupled coplanar waveguide segments formed of conductive material deposited on said substrate;

diode means for coupling said first and second filter means; and a capacitor coupling said diode means to said groundplane.

10. A harmonic mixer active probe having an input node and an input/output node at which local oscillator signals are received and from which intermediate frequency output signals are output, comprising:

a substrate having at least one conductive groundplane formed thereon;

a nonlinear element for receiving said local oscillator signals and said input signals from said input node and for generating only odd order harmonics of said local oscillator signals and only even order mixing products of said local oscillator harmonics signals and said input signals received at said input node;

means formed on said substrate for receiving said local oscillator signals at said input/output node and for guiding said local oscillator signals to said nonlinear element, via a first plurality of electrically coupled coplanar waveguide segments formed of conductive material deposited on said substrate, and for suppressing the odd order harmonics of said local oscillator signal and the input signals received at said input node propagating toward said input/output node;

means formed on said substrate for receiving input signals at said input node and guiding said input signals to said nonlinear element, via a second plurality of electrically coupled coplanar waveguide segments formed of conductive material deposited on said substrate wherein at least one of said highpass segments is terminated in a short circuit to said groundplane, for suppressing said local oscillator signals propagating toward said input node, and for reflecting a predetermined mixing product toward said input/output node and suppressing predetermined undesired mixing products.

* * * * *